United States Patent
Aridomi et al.

(10) Patent No.: US 11,604,413 B2
(45) Date of Patent: Mar. 14, 2023

(54) PHOTOSENSITIVE COMPOSITION, TRANSFER FILM, CURED FILM, AND MANUFACTURING METHOD OF TOUCH PANEL

(71) Applicant: FUJIFILM Corporation, Tokyo (JP)

(72) Inventors: Takashi Aridomi, Shizuoka (JP); Shinichi Kanna, Shizuoka (JP); Satoru Yamada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 549 days.

(21) Appl. No.: 16/238,673

(22) Filed: Jan. 3, 2019

(65) Prior Publication Data

US 2019/0137874 A1  May 9, 2019

Related U.S. Application Data

(63) Continuation of application No. PCT/JP2017/022522, filed on Jun. 19, 2017.

(30) Foreign Application Priority Data

Jul. 6, 2016  (JP) .............................. JP2016-134491

(51) Int. Cl.
| | |
|---|---|
| *G03F 7/038* | (2006.01) |
| *G03F 7/16* | (2006.01) |
| *G06F 3/041* | (2006.01) |
| *C08F 290/12* | (2006.01) |
| *G03F 7/027* | (2006.01) |
| *H05K 3/28* | (2006.01) |
| *G03F 7/20* | (2006.01) |
| *G03F 7/32* | (2006.01) |
| *G03F 7/38* | (2006.01) |

(52) U.S. Cl.
CPC ............ *G03F 7/038* (2013.01); *C08F 290/12* (2013.01); *G03F 7/027* (2013.01); *G03F 7/0388* (2013.01); *G03F 7/16* (2013.01); *G03F 7/2004* (2013.01); *G03F 7/322* (2013.01); *G03F 7/38* (2013.01); *G06F 3/041* (2013.01); *H05K 3/28* (2013.01); *G06F 2203/04103* (2013.01); *H05K 3/287* (2013.01)

(58) Field of Classification Search
CPC .......... G03F 7/038; G03F 7/11; G03F 7/0388; G03F 7/30
See application file for complete search history.

(56) References Cited

U.S. PATENT DOCUMENTS

| | | | | |
|---|---|---|---|---|
| 8,785,107 | B2* | 7/2014 | Hayashi ................. | G03F 7/0046 430/270.1 |
| 9,316,907 | B2* | 4/2016 | Tsai ..................... | G03F 7/0007 |
| 10,104,781 | B2* | 10/2018 | Okade .................. | G03F 7/2053 |
| 2004/0115558 | A1* | 6/2004 | Yang ..................... | G03F 7/0007 430/270.1 |
| 2009/0202749 | A1 | 8/2009 | Hayashi et al. | |
| 2015/0079804 | A1* | 3/2015 | Kitagawa .............. | B29C 59/005 438/763 |
| 2016/0068718 | A1* | 3/2016 | Suwa ................... | B32B 38/0008 156/275.5 |
| 2016/0118155 | A1* | 4/2016 | Kobayashi .............. | H01B 1/22 200/600 |
| 2016/0330845 | A1 | 11/2016 | Okade et al. | |
| 2017/0146905 | A1 | 5/2017 | Aridomi et al. | |

FOREIGN PATENT DOCUMENTS

| | | |
|---|---|---|
| CN | 103109235 A | 5/2013 |
| CN | 104497204 A | 4/2015 |
| CN | 105073800 A | 11/2015 |
| JP | 2000298337 A | 10/2000 |
| JP | 2000298339 A | 10/2000 |
| JP | 2002341531 A | 11/2002 |
| JP | 2004285271 A | 10/2004 |
| JP | 2004287230 A | 10/2004 |
| JP | 2007002030 A | 1/2007 |
| JP | 2007256669 A | 10/2007 |
| JP | 2008-250074 A | 10/2008 |
| JP | 2010145858 A | 7/2010 |
| JP | 2013195956 A | 9/2013 |
| JP | 2015067699 A | 4/2015 |
| JP | 2016051470 A | 4/2016 |
| WO | 2015/098870 A1 | 7/2015 |

OTHER PUBLICATIONS

International Search Report for PCT/JP2017/022522 dated Sep. 12, 2017.
Written Opinion for PCT/JP2017/022522 dated Sep. 12, 2017.
International Preliminary Report on Patentability and Translation of Written Opinion, dated Jan. 8, 2019 from the International Bureau in counterpart International application No. PCT/JP2017/022522.
Office Action dated Nov. 5, 2019, from the Japanese Patent Office in counterpart Japanese Application No. 2018-526002.
Notice of Reasons for Refusal dated Jul. 9, 2019 from the Japanese Patent Office in application No. 2018-526002.
Office Action dated Jun. 23, 2021 from the Chinese Patent Office in Chinese Application No. 201780039804.4.
Office Action dated Mar. 4, 2022 from the Chinese Patent Office in Chinese Application No. 201780039804.4.

* cited by examiner

*Primary Examiner* — John S Chu
(74) *Attorney, Agent, or Firm* — Sughrue Mion, PLLC

(57) ABSTRACT

Provided is a photosensitive composition including: a polymer (P) which includes a structural unit derived from a vinylbenzene derivative, a structural unit including a radical polymerizable group, and a structural unit including at least one kind of functional group selected from the group consisting of a primary hydroxyl group and an amino group, and in which the content of the structural unit derived from the vinylbenzene derivative is equal to or greater than 30% by mol; and a radical polymerization initiator.

26 Claims, 2 Drawing Sheets

PHOTOSENSITIVE COMPOSITION, TRANSFER FILM, CURED FILM, AND MANUFACTURING METHOD OF TOUCH PANEL

CROSS-REFERENCE TO RELATED APPLICATION

This application is a Continuation of International Application No. PCT/JP2017/022522, filed Jun. 19, 2017, which claims priority to Japanese Patent Application No. 2016-134491 filed Jul. 6, 2016. Each of the above applications is hereby expressly incorporated by reference, in its entirety, into the present application.

BACKGROUND OF THE INVENTION

1. Field of the Invention

The present disclosure relates to a photosensitive composition, a transfer film, a cured film, and a manufacturing method of a touch panel.

2. Description of the Related Art

In the related art, a photosensitive composition and a transfer film formed of the photosensitive composition (also referred to as a "photosensitive film") has been known.

For example, as a photosensitive film, with which a cured film having high sensitivity in a case of using a blue-violet laser exposure system, excellent peeling properties of a protective film and a support, excellent embedding properties into ruggedness of a surface of a substrate in a case of lamination on the substrate, and excellent insulating properties, heat resistance, chemical resistance, moisture resistance, and surface hardness after the development, without a deterioration of developability in a case of long-term storage and bleeding-out of a photosensitive layer from a roll end surface is obtained, a photosensitive film including at least a support and a photosensitive layer on this support, in which this photosensitive layer is formed of a photosensitive composition including a specific component, a blue-violet laser beam (wavelength=405±5 nm) has sensitivity of 1 to 100 mJ/cm$^2$, a melt viscosity at 30° C. is 1×10$^5$ to 1×10$^7$ Pa·s, and a melt viscosity at 80° C. is 1×10$^2$ to 1×10$^3$ Pa·s (for example, see JP2007-256669A) has been known.

In addition, as a photosensitive solder resist composition, with which a high-performance cured film having excellent heat resistance, moist heat resistance, adhesiveness, mechanical properties, and electrical properties, and which is suitably used for manufacturing a printed wiring board, a high-density multilayer plate, a semiconductor package, and the like, a photosensitive solder resist composition including an elastomer obtained by a reaction between carboxyl group-containing polyurethane and a compound including an epoxy group and a vinyl group in one molecule, a polymerizable compound, a photopolymerization initiator, a thermal crosslinking agent, a colorant, and a heat curing accelerator has been known (for example, see JP2007-002030A). JP2007-002030A also discloses a photosensitive film including a support and a photosensitive layer formed of the photosensitive solder resist composition described above.

Further, as a photosensitive resin composition having high sensitivity and high resolution and excellent temporal stability of sensitivity, film curing properties, and thermal impact resistance, and capable of efficiently forming a high-definition permanent pattern, a photosensitive resin composition including a binder (A), a polymerizable compound (B), and a photopolymerization initiator (C), in which the binder (A) includes a copolymer-modified resin obtained by adding a specific epoxy compound to a part of a carboxyl group of a copolymer of a specific monomer, and the photopolymerization initiator (C) includes an oxime derivative (for example, see JP2008-250074A). JP2008-250074A also discloses a photosensitive film including a support and a photosensitive layer formed of the photosensitive resin composition.

SUMMARY OF THE INVENTION

However, a decrease in water vapor transmission rate (WVTR) may be necessary for a cured film obtained by curing a photosensitive composition. For example, in a case of forming a protective film for a touch panel included in a touch panel, as the cured film obtained by curing a photosensitive composition, a decrease in WVTR is necessary for the protective film for a touch panel to be formed (that is, cured film).

In regards to this point, in the cured film obtained by curing the photosensitive composition disclosed in JP2007-256669A, JP2007-002030A, and JP2008-250074A, the WVTR may not be decreased.

One embodiment of the invention is made in view of such circumstances, and an object of the invention is to provide a photosensitive composition and a transfer film capable of forming a cured film having a decreased water vapor transmission rate (WVTR), a cured film having a decreased water vapor transmission rate (WVTR), a touch panel including the cured film described above, and a manufacturing method of a touch panel formed of the photosensitive composition and the transfer film.

Means for achieving the object described above include the following aspects.

<1> A photosensitive composition including: a polymer (P) which includes a structural unit derived from a vinylbenzene derivative, a structural unit including a radical polymerizable group, and a structural unit including at least one kind of functional group selected from the group consisting of a primary hydroxyl group and an amino group, and in which an amount of the structural unit derived from the vinylbenzene derivative is equal to or greater than 30% by mol with respect to a total amount of all of the structural units included in the polymer (P); and a radical polymerization initiator.

<2> The photosensitive composition according to <1>, in which the amount of the structural unit derived from the vinylbenzene derivative in the polymer (P) is equal to or greater than 40% by mol with respect to a total amount of all of the structural units included in the polymer (P).

<3> The photosensitive composition according to <1> or <2>, in which an amount of the structural unit including the radical polymerizable group in the polymer (P) is equal to or greater than 10% by mol with respect to a total amount of all of the structural units included in the polymer (P).

<4> The photosensitive composition according to any one of <1> to <3>, in which an amount of the structural unit including at least one kind of functional group selected from the group consisting of a primary hydroxyl group and an amino group in the polymer (P) is equal to or greater than 10% by mol with respect to a total amount of all of the structural units included in the polymer (P).

<5> The photosensitive composition according to any one of <1> to <4>, in which the polymer (P) further includes a structural unit including an acid group.

<6> The photosensitive composition according to any one of <1> to <5>, further comprising: a di- or higher functional radical polymerizable monomer.

<7> The photosensitive composition according to any one of <1> to <6>, further comprising: a compound including two or more thermal reactive groups in one molecule.

<8> The photosensitive composition according to <7>, in which the thermal reactive group is at least one kind selected from the group consisting of an isocyanate group, a ketene group, a blocked isocyanate group, and a blocked ketene group.

<9> The photosensitive composition according to any one of <1> to <8>, which is used for forming a protective film for a touch panel.

<10> A transfer film comprising: a temporary support; and a photosensitive layer including solid contents of the photosensitive composition according to any one of <1> to <9>.

<11> The transfer film according to <10>, which is used for forming a protective film for a touch panel.

<12> A cured film which is a cured product of solid contents of the photosensitive composition according to any one of <1> to <9>.

<13> A touch panel including the cured film according to <12>.

<14> A manufacturing method of a touch panel comprising: preparing a substrate for a touch panel including a structure in which at least one of an electrode for a touch panel or a wiring for a touch panel is disposed on the substrate; forming a photosensitive layer on a surface of the substrate for a touch panel on a side at which at least one of the electrode for a touch panel or the wiring for a touch panel is disposed, by using the photosensitive composition according to <9> or the transfer film according to <11>; performing pattern-exposing of the photosensitive layer formed on the substrate for a touch panel; and developing the pattern-exposed photosensitive layer to obtain a protective film for a touch panel which protects at least a part of at least one of the electrode for a touch panel or the wiring for a touch panel.

According to one embodiment of the invention, a photosensitive composition and a transfer film capable of forming a cured film having a decreased water vapor transmission rate (WVTR), a cured film having a decreased water vapor transmission rate (WVTR), a touch panel including the cured film described above, and a manufacturing method of a touch panel using the photosensitive composition and the transfer film.

DESCRIPTION OF THE PREFERRED EMBODIMENTS

Figure 1:
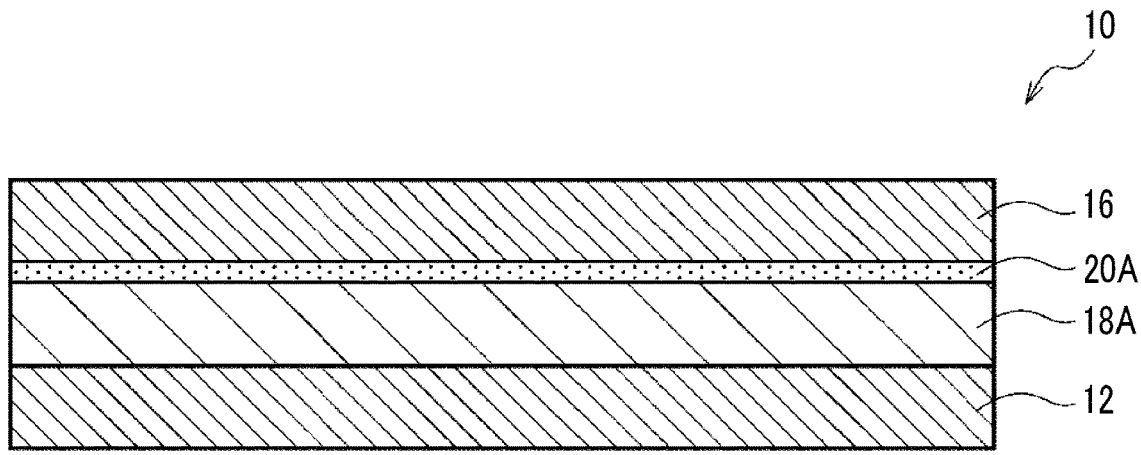
FIG. 1 is a schematic cross sectional view showing an example of a transfer film according to one embodiment of the invention.

Hereinafter, one embodiment of the invention (hereinafter, also referred to as the "embodiment") will be described.

In this specification, a range of numerical values shown using "to" means a range including numerical values before and after "to" as a lower limit value and an upper limit value.

In this specification, in a case where a plurality of substances corresponding to components are present in the composition, the amount of each component in the composition means a total amount of the plurality of substances present in the composition, unless otherwise noted.

In this specification, a term "step" not only includes an independent step, but also includes a step, in a case where the step may not be distinguished from the other step, as long as the expected object of the step is achieved.

In this specification, "(meth)acrylic acid" has a concept including both acrylic acid and a methacrylic acid, "(meth)acrylate" has a concept including both acrylate and methacrylate, and "(meth)acryloyl group" has a concept including both acryloyl group and methacryloyl group.

In the specification, the "solid contents of the photosensitive composition" mean components other than a solvent in the photosensitive composition, and the "amount of solid contents of the photosensitive composition" means a total amount of the solid contents in the photosensitive composition.

In the specification, "light" has a concept including active energy ray such as a γ ray, a (ray, an electron ray, an ultraviolet ray, a visible light ray, and an infrared ray.

In the specification, a "transparent" state means that a minimum light transmittance at a wavelength of 400 nm to 800 nm is equal to or greater than 80% (preferably equal to or greater than 90% and more preferably equal to or greater than 95%).

In the specification, a ratio of the structural units of the polymer represents a molar ratio, unless otherwise noted.

[Photosensitive Composition]

A photosensitive composition of the embodiment includes a polymer (P) which includes a structural unit derived from a vinylbenzene derivative (hereinafter, also referred to as a "vinylbenzene derivative unit"), a structural unit including a radical polymerizable group (hereinafter, also referred to as a "radical polymerizable group-containing unit"), and a structural unit including at least one kind of functional group selected from a primary hydroxyl group and an amino group (hereinafter, also referred to as a "primary hydroxyl group and/or amino group-containing unit"), and in which the amount of the vinylbenzene derivative unit is equal to or greater than 30% by mol with respect to a total amount of all of the structural units included in the polymer (P); and a radical polymerization initiator.

In the specification, the primary hydroxyl group represents s a hydroxyl group directly bonded to a primary carbon atom. Here, the primary carbon atom is defined as usual.

In addition, a hydroxyl group included in a structure of a carboxyl group (that is, —C(=O)OH group) does not correspond to the primary hydroxyl group.

In the specification, the concept of the "amino group" includes both of an unsubstituted amino group and a substituted amino group.

The amino group which can be included in the primary hydroxyl group and/or amino group-containing unit is preferably an amino group directly bonded to the primary carbon atom.

The photosensitive composition of the embodiment includes the polymer (P) including a radical polymerizable group-containing unit, and the radical polymerization initiator, and accordingly, a cured film is formed by being cured by radical polymerization. In the formed cured film, a decrease in water vapor transmission rate (WVTR) is decreased.

A reason of exhibiting such an effect is not clear, and it is assumed that the reason thereof is because the WVTR of the cured film is decreased in accordance with hydrophobization of the cured film due to the vinylbenzene derivative unit, and refinement of the cured film due to the radical polymerizable group-containing unit, the primary hydroxyl group, and/or the amino group-containing unit.

In the photosensitive composition of the embodiment, in a case where the primary hydroxyl group and/or the amino group-containing unit in the polymer (P) is changed to a structural unit which does not include the primary hydroxyl group and the amino group and includes a secondary hydroxyl group (that is, a hydroxyl group directly bonded to a secondary carbon atom), the WVTR of the cured film increases (for example, see polymers R5 to R7 of Comparative Examples 5 to 7 which will be described later).

The photosensitive composition of the embodiment is used for forming the cured film requiring a decrease in WVTR, without particular limitations.

As an example of the cured film requiring a decrease in WVTR, a protective film for a touch panel is used.

Hereinafter, a touch panel and a protective film for a touch panel will be described.

As an electronic apparatus such as a mobile phone, a car navigator, a personal computer, a ticket vending machine, or a terminal device of a bank, an electronic apparatus in which a touch panel (that is, a tablet type input device) is disposed on a surface of a liquid crystal display device including an image display region is known.

In such an electronic apparatus, information is input by touching a portion corresponding to an instruction image of the touch panel with a finger or a touch pen, while referring the instruction image displayed on the image display region.

In the touch panel, at least one of an electrode for a touch panel (for example, transparent electrode pattern) or a wiring for a touch panel (for example, a leading wiring formed on a frame portion (for example, metal wiring such as a copper wire)) is provided. In order to protect at least one of the electrode for a touch panel or the wiring for a touch panel (hereinafter, also referred to as "the electrode and the like"), the protective film for a touch panel which covers the electrode and the like directly or through other layers is provided in the touch panel.

In the touch panel, the electrode and the like may be corroded due to moisture (that is, vapor). In addition, a thickness of the protective film for a touch panel may be, for example, thinner than a thickness of a protective film for a typical printed wiring board. Accordingly, in order to prevent corrosion of the electrode and the like, a decrease in WVTR may be required in the protective film for a touch panel.

Therefore, the photosensitive composition of the embodiment is particularly suitable for forming the protective film for a touch panel which protects the electrode and the like of the touch panel including the electrode and the like (that is, at least one of the electrode for a touch panel or the wiring for a touch panel) as the cured film of the photosensitive composition.

Hereinafter, each component which can be included in the photosensitive composition of the embodiment will be described.

<Polymer (P)>

The photosensitive composition of the embodiment includes the polymer (P) including the vinylbenzene derivative unit, the radical polymerizable group-containing unit, and the primary hydroxyl group and/or amino group-containing unit.

At least two of the vinylbenzene derivative unit, the radical polymerizable group-containing unit, and the primary hydroxyl group and/or amino group-containing unit may be the same structural unit. From a viewpoint of more easily exhibiting the effect of the embodiment, the vinylbenzene derivative unit, the radical polymerizable group-containing unit, and the primary hydroxyl group and/or amino group-containing unit are respectively preferably individual structural units.

The polymer (P) may include a structural unit other than the units described above.

(Vinylbenzene Derivative Unit)

The polymer (P) includes at least one kind of the vinylbenzene derivative unit (that is, a structural unit derived from the vinylbenzene derivative).

The vinylbenzene derivative unit is preferably a unit represented by Formula (1) (hereinafter, also referred to as a "unit (1)").

(1)

In Formula (1), n represents an integer of 0 to 5.

In Formula (1), $R^1$ represents a substituent. In a case where n is equal to or greater than 2, two $R^1$'s may be bonded to each other to form a condensed ring structure. In a case where n is equal to or greater than 2, $R^1$'s may be the same to each other or different from each other.

The substituent represented by $R^1$ is preferably a halogen atom, an alkyl group, an aryl group, an alkoxy group, or a hydroxyl group.

The halogen atom which is one preferred aspect of $R^1$ is preferably a fluorine atom, a chlorine atom, a bromine atom, or an iodine atom, and more preferably a fluorine atom, a chlorine atom, or a bromine atom.

The number of carbon atoms of the alkyl group which is one preferred aspect of $R^1$ is preferably 1 to 20, more preferably 1 to 12, even more preferably 1 to 6, still preferably 1 to 3, still more preferably 1 or 2, and particularly preferably 1.

The number of carbon atoms of the aryl group which is one preferred aspect of $R^1$ is preferably 6 to 20, more preferably 6 to 12, even more preferably 6 to 10, and particularly preferably 6.

The number of carbon atoms of the alkoxy group which is one preferred aspect of $R^1$ is preferably 1 to 20, more preferably 1 to 12, even more preferably 1 to 6, still preferably 1 to 3, still more preferably 1 or 2, and particularly preferably 1.

In Formula (1), n is particularly preferably an integer of 0 to 2.

In Formula (1), in a case where n is 2, as the condensed ring structure which can be formed by the bonding of two $R^1$'s to each other, a naphthalene ring structure or an anthracene ring structure is preferable.

Examples of a monomer for forming the vinylbenzene derivative unit (for example, the unit (1)) include styrene, 1-vinylnaphthalene, 2-vinylnaphthalene, vinylbiphenyl, vinylanthracene, 4-hydroxystyrene, 4-bromostyrene, and 4-methoxystyrene, styrene is particularly preferable.

The amount of the vinylbenzene derivative unit with respect to a total amount of all of the structural units included in the polymer (P) (hereinafter, also simply referred to as the "amount of the vinylbenzene derivative unit") is equal to or greater than 30% by mol. Accordingly, the hydrophobization of the formed cured film is exhibited and the WVTR of the cured film tends to be decreased.

The amount of the vinylbenzene derivative unit is preferably equal to or greater than 40% by mol, from a viewpoint of further decreasing the WVTR of the cured film.

The amount of the vinylbenzene derivative unit is preferably equal to or smaller than 80% by mol, more preferably equal to or smaller than 70% by mol, even more preferably equal to or smaller than 60% by mol, and particularly preferably equal to or smaller than 50% by mol.

(Radical Polymerizable Group-Containing Unit)

The polymer (P) includes at least one kind of the radical polymerizable group-containing unit (that is, a structural unit including a radical polymerizable group).

As the radical polymerizable group, a group including an ethylenically double bond (hereinafter, also referred to as an "ethylenically unsaturated group") is preferable and a (meth) acryloyl group is more preferable.

As the radical polymerizable group-containing unit, a unit represented by Formula (2) (hereinafter, also referred to as a "unit (2)") is preferable.

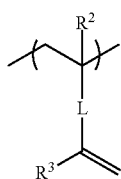

(2)

In Formula (2), R2 and R3 each independently represent a hydrogen atom or an alkyl group and L represents divalent linking group.

The number of carbon atoms of the alkyl group represented by $R^2$ and $R^3$ is each independently preferably 1 to 3, more preferably 1 or 2, and particularly preferably 1.

As the divalent linking group represented by L, one group selected from the group consisting of a carbonyl group (that is, a —C(=O)— group), an oxygen atom (that is, a —O— group), an alkylene group, and an arylene group, or a group formed by linking two or more groups selected from the group described above is preferable.

The alkylene group or the arylene group may be respectively substituted with a substituent (for example, a hydroxyl group other than primary hydroxyl group, or a halogen atom).

The divalent linking group represented by L may have a branched structure.

The number of carbon atoms of the divalent linking group represented by L is preferably 1 to 30, more preferably 1 to 20, and even more preferably 2 to 10.

the divalent linking group represented by L is particularly preferably a group shown below.

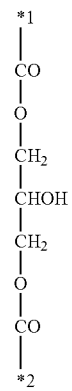

(L-1)

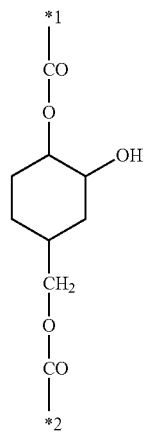

(L-2)

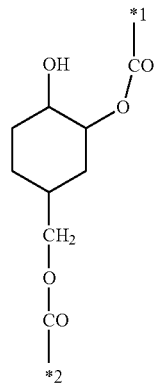

(L-3)

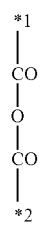

(L-4)

-continued

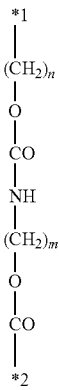

(L-5)

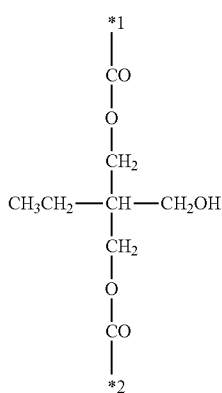

(L-6)

In each group described above, *1 represents a bonding site with a carbon atom included in a main chain in Formula (2), and *2 represents a bonding site with a carbon atom forming a double bond in Formula (2).

In addition, in (L-5), n and m each independently represent an integer of 1 to 6.

Examples of the radical polymerizable group-containing unit include a structural unit in which an epoxy group-containing monomer is added to a (meth)acrylic acid unit, and a structural unit in which an isocyanate group-containing monomer is added to a hydroxyl group-containing monomer unit.

As the epoxy group-containing monomer, an epoxy group-containing (meth)acrylate having 5 to 24 carbon atoms in total is preferable, an epoxy group-containing (meth)acrylate having 5 to 12 carbon atoms in total is more preferable, and glycidyl (meth)acrylate or 3,4-epoxycyclohexylmethyl (meth)acrylate is particularly preferable.

As the hydroxyl group-containing monomer for forming the hydroxyl group-containing monomer unit, hydroxyalkyl (meth)acrylate having 4 to 24 carbon atoms in total is preferable, hydroxyalkyl (meth)acrylate having 4 to 12 carbon atoms in total is more preferable, and hydroxyethyl (meth)acrylate is particularly preferable.

Here, the "(meth)acrylic acid unit" means a structural unit derived from (meth)acrylic acid.

In the same manner as described above, a term with a word "unit" at the end of the name of the monomer in the specification (for example, the "hydroxyl group-containing monomer unit") means a structural unit derived from the monomer (for example, the hydroxyl group-containing monomer).

More specific examples of the radical polymerizable group-containing unit include a structural unit in which glycidyl (meth)acrylate is added to a (meth)acrylic acid unit, a structural unit in which (meth)acrylic acid is added to a (meth)acrylic acid unit, a structural unit in which 3,4-epoxycyclohexylmethyl (meth)acrylate is added to a (meth)acrylic acid unit, a structural unit in which 2-isocyanatoethyl (meth)acrylate is added to a hydroxyethyl (meth)acrylate unit, a structural unit in which 2-isocyanatoethyl (meth)acrylate is added to a hydroxybutyl (meth)acrylate unit, and a structural unit in which 2-isocyanatoethyl (meth)acrylate is added to a hydroxystyrene unit.

As the radical polymerizable group-containing unit, a structural unit in which glycidyl (meth)acrylate is added to a (meth)acrylic acid unit or a structural unit in which 3,4-epoxycyclohexylmethyl (meth)acrylate is added to a (meth)acrylic acid unit is more preferable, and a structural unit in which glycidyl methacrylate is added to a methacrylic acid unit or a structural unit in which 3,4-epoxycyclohexyl methacrylate is added to a methacrylic acid unit is particularly preferable.

The amount of the radical polymerizable group-containing unit with respect to a total amount of all of the structural units included in the polymer (P) (hereinafter, also simply referred to as the "amount of the radical polymerizable group-containing unit") is not particularly limited, and the amount of the radical polymerizable group-containing unit is preferably equal to or greater than 1% by mol, more preferably equal to or greater than 5% by mol, and particularly preferably equal to or greater than 10% by mol, from a viewpoint of further preventing the WVTR of the cured film.

An upper limit of the amount of the radical polymerizable group-containing unit is not particularly limited, and the amount of the radical polymerizable group-containing unit is preferably equal to or smaller than 50% by mol, more preferably equal to or smaller than 30% by mol, and particularly preferably equal to or smaller than 20% by mol.

(Primary Hydroxyl Group and/or Amino Group-Containing Unit)

The polymer (P) includes at least one kind of the primary hydroxyl group and/or amino group-containing unit (that is, a structural unit including at least one kind of functional group selected from the group consisting of a primary hydroxyl group and an amino group).

As the primary hydroxyl group and/or amino group-containing unit, a unit represented by Formula (3) (hereinafter, also referred to as a "unit (3)") is preferable.

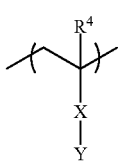

(3)

In Formula (3), $R^4$ represents a hydrogen atom or an alkyl group, X represents divalent linking group, and Y represents a primary hydroxyl group or an amino group.

From a viewpoint of improving sensitivity, Y is preferably a primary hydroxyl group.

In Y, as the amino group, an amino group represented by Formula (a) is preferable.

$$*-NR^{a1}R^{a2} \quad (a)$$

In Formula (a), * represents a bonding site, and $R^{a1}$ and $R^{a2}$ each independently represent a hydrogen atom, an alkyl group, or an aryl group.

The number of carbon atoms of the alkyl group of $R^{a1}$ and $R^{a2}$ is each independently preferably 1 to 20, more preferably 1 to 12, and particularly preferably 1 to 6.

The number of carbon atoms of the aryl group of $R^{a1}$ and $R^{a2}$ is each independently preferably 6 to 20, more preferably 6 to 12, even more preferably 6 to 10, and particularly preferably 6.

From a viewpoint of further decreasing the WVTR of the cured film, in Formula (a), at least one of $R^{a1}$ or $R^{a2}$ is preferably a hydrogen atom, any one of $R^{a1}$ and $R^{a2}$ is more preferably a hydrogen atom, and it is particularly preferable that one of $R^{a1}$ and $R^{a2}$ is a hydrogen atom and the other one thereof is an alkyl group.

In Formula (3), the number of carbon atoms of the alkyl group of $R^4$ is preferably 1 to 3, more preferably 1 or 2, and particularly preferably 1.

As a divalent linking group represented by X, one group selected from the group consisting of a carbonyl group (that is, a —C(=O)— group), an oxygen atom (that is, a —O— group), an alkylene group, and an arylene group, or a group formed by linking two or more groups selected from the group described above is preferable.

The alkylene group or the arylene group may be respectively substituted with a substituent (for example, a hydroxyl group other than primary hydroxyl group, or a halogen atom).

The divalent linking group represented by X may have a branched structure.

In a case where Y is a primary hydroxyl group, a bonding portion of X with Y is an alkylene group, according to the definition of the primary hydroxyl group.

The number of carbon atoms of the divalent linking group represented by X is preferably 1 to 30, more preferably 1 to 20, and even more preferably 2 to 10.

The divalent linking group represented by X is particularly preferably the following group.

(X-1)

In the group, *1 represents a bonding site with a carbon atom included in a main chain in Formula (3), *2 represents a bonding site with Y in Formula (3), and n represents an integer of 1 to 12 (preferably 1 to 6).

Examples of a monomer for forming the primary hydroxyl group and/or amino group-containing unit include hydroxyethyl (meth)acrylate, hydroxypropyl (meth)acrylate, hydroxybutyl (meth)acrylate, 2-(t-butylamino) ethyl (meth)acrylate, and 2-(phenylamino) ethyl (meth)acrylate.

Among these, hydroxyethyl (meth)acrylate, hydroxybutyl (meth)acrylate, or 2-(t-butylamino) ethyl (meth)acrylate is preferable, and hydroxyethyl methacrylate, hydroxybutyl methacrylate, or 2-(t-butylamino) ethyl methacrylate is particularly preferable.

The amount of the primary hydroxyl group and/or amino group-containing unit with respect to a total amount of all of the structural units included in the polymer (P) (hereinafter, also simply referred to as the "amount of the primary hydroxyl group and/or amino group-containing unit") is not particularly limited, and the amount of the primary hydroxyl group and/or amino group-containing unit is preferably equal to or greater than 1% by mol, more preferably equal to or greater than 5% by mol, and particularly preferably equal to or greater than 10% by mol, from a viewpoint of further decreasing the WVTR of the cured film.

An upper limit of the amount of the primary hydroxyl group and/or amino group-containing unit is not particularly limited, and the amount of the primary hydroxyl group and/or amino group-containing unit is preferably equal to or smaller than 50% by mol and more preferably equal to or smaller than 30% by mol.

(Structural Unit Including Acid Group)

The polymer (P) preferably includes at least one kind of a structural unit including an acid group (hereinafter, also referred to as an "acid group-containing unit").

In a case where the polymer (P) includes the acid group-containing unit, the photosensitive composition of the embodiment includes an alkali solubility. Accordingly, developability in a case of forming the cured film by exposing and developing a film (for example, a photosensitive layer which will be described later) including solid contents of the photosensitive composition of the embodiment is improved.

In addition, in a case where the polymer (P) includes at least one kind of the acid group-containing unit, saline heat moisture resistance of the cured film is also improved. Here, the saline heat moisture resistance means heat moisture resistance, in a case where the cured film is exposed to liquid including salt such as sweat (the same applies hereinafter).

Examples of the acid group of the acid group-containing unit include a carboxyl group, a sulfonic acid group, a sulfuric acid group, and a phosphoric acid group, and a carboxyl group is particularly preferable.

The acid group-containing unit is preferably a unit represented by Formula (4) (hereinafter, also referred to as a "unit (4)").

(4)

In Formula (4), $R^5$ represents a hydrogen atom or an alkyl group.

The number of carbon atoms of the alkyl group represented by $R^5$ is preferably 1 to 3, more preferably 1 or 2, and particularly preferably 1.

$R^5$ is preferably a hydrogen atom or an alkyl group having 1 to 3 carbon atoms, more preferably a hydrogen atom, a methyl group, or an ethyl group, and particularly preferably a hydrogen atom or a methyl group.

The monomer for forming the acid group-containing unit is particularly preferably a (meth)acrylic acid.

In a case where the polymer (P) includes the acid group-containing unit, the amount of the acid group-containing unit with respect to a total amount of all of the structural units included in the polymer (P) (hereinafter, also simply referred to as the "amount of the acid group-containing unit") is not particularly limited, and the amount of the acid group-containing unit is preferably equal to or greater than 1% by mol, more preferably equal to or greater than 5% by mol, and particularly preferably equal to or greater than 10% by mol, from a viewpoint of developability.

In a case where the polymer (P) includes the acid group-containing unit, an upper limit of the amount of the acid group-containing unit is not particularly limited, and the amount of the acid group-containing unit is preferably equal to or smaller than 50% by mol and more preferably equal to or smaller than 30% by mol, from a viewpoint of further decreasing the WVTR of the cured film.

In a case where the polymer (P) includes the acid group-containing unit, an acid value of the polymer (P) is preferably equal to or greater than 60 mgKOH/g, more preferably 60 mgKOH/g to 200 mgKOH/g, even more preferably 60 mgKOH/g to 150 mgKOH/g, and particularly preferably 60 mgKOH/g to 110 mgKOH/g.

As the acid value, a value of a theoretical acid value calculated by a calculating method disclosed in a paragraph 0063 of JP2004-149806A, a paragraph 0070 of JP2012-211228A, and the like can be used.

(Other Structural Units)

The polymer (P) may include a structural unit other than the structural unit described above.

The other structural unit is an alkyl (meth)acrylate unit which does not include any of the radical polymerizable group, the acid group, the primary hydroxyl group, and the amino group.

The total number of carbon atoms of the alkyl (meth) acrylate unit as the other structural unit is preferably 4 to 24 and more preferably 4 to 20.

The alkyl (meth)acrylate unit may include at least one kind of structure selected from the group consisting of a cyclic structure and a branched structure.

The amount of the other structural unit with respect to a total amount of all of the structural units included in the polymer (P) is not particularly limited, and the amount of the other structural unit is preferably 0% by mol to 30% by mol and more preferably 0% by mol to 20% by mol, from a viewpoint of a decrease in WVTR of the cured film.

A weight-average molecular weight (Mw) of the polymer (P) is not particularly limited, and is preferably 10,000 to 200,000, more preferably 10,000 to 100,000, and particularly preferably 15,000 to 60,000.

In the specification, the measurement of the weight-average molecular weight (Mw) can be performed by gel permeation chromatography (GPC) under the following conditions.

A calibration curve is drawn from eight samples of "STANDARD SAMPLES TSK standard, polystyrene" manufactured by Tosoh Corporation: "F-40", "F-20", "F-4", "F-1", "A-5000", "A-2500", "A-1000", "n-propylbenzene".

—Conditions—
GPC: HLC (registered trademark)-8020 GPC (manufactured by Tosoh Corporation)
Column: TSKgel (registered trademark), three Super Multipore HZ-H (manufactured by Tosoh Corporation, 4.6 mmID×15 cm)
Eluent: Tetrahydrofuran (THF)
Sample Concentration: 0.45% by mass
Flow rate: 0.35 ml/min
Sample injected amount: 10 μL
Measurement temperature: 40° C.
Detector: differential refractometer (RI)

A content of the polymer (P) in the photosensitive composition of the embodiment is not particularly limited.

The content of the polymer (P) is preferably 10% by mass to 95% by mass, more preferably 10% by mass to 60% by mass, and particularly preferably 20% by mass to 50% by mass with respect to the amount of solid contents of the photosensitive composition.

The photosensitive composition of the embodiment may include a polymer other than the polymer (P) (for example, an acrylic resin, a polysiloxane resin, a polystyrene resin, or a polyimide resin).

A content of the polymer (P) with respect to a total content of the polymers included in the photosensitive composition of the embodiment is preferably 60% by mass to 100% by mass, more preferably 80% by mass to 100% by mass, and particularly preferably 90% by mass to 100% by mass.

<Radical Polymerization Initiator>

The photosensitive composition of the embodiment includes at least one kind of the radical polymerization initiator.

The radical polymerization initiator is not particularly limited, and a well-known radical polymerization initiator can be used.

Examples of the radical polymerization initiator include a radical polymerization initiator including an oxime ester structure (hereinafter, also referred to as an "oxime-based polymerization initiator"), a radical polymerization initiator including an α-aminoalkylphenone structure (hereinafter, also referred to as an "α-aminoalkylphenone-based polymerization initiator), a radical polymerization initiator including an α-hydroxyalkylphenone structure (hereinafter, also referred to as an "α-hydroxyalkylphenone-based polymerization initiator), and a radical polymerization initiator including an acylphosphine oxide structure (hereinafter, also referred to as an "acylphosphine oxide-based polymerization initiator).

The radical polymerization initiator preferably includes at least one kind selected from the group consisting of the oxime-based polymerization initiator, the α-aminoalkylphenone-based polymerization initiator, and the α-hydroxyalkylphenone-based polymerization initiator, and more preferably includes at least one kind selected from the group consisting of the oxime-based polymerization initiator and the α-aminoalkylphenone-based polymerization initiator.

In addition, as the radical polymerization initiator, for example, polymerization initiators disclosed in paragraphs 0031 to 0042 of JP2011-095716A and paragraphs 0064 to 0081 of JP2015-014783A may be used.

Examples of a commercially available product of the radical polymerization initiator include 1,2-octanedione, 1-[4-(phenylthio)-, 2-(O-benzoyloxime)] (product name: IRGACURE (registered trademark) OXE-01, manufactured by BASF Japan Ltd.), ethan, 1-[9-ethyl-6-(2-methylbenzoyl)-9H-carbazol-3-yl]-, 1-(0-acetyloxime) (product name: IRGACURE OXE-02, manufactured by BASF Japan Ltd.), 2-(dimethylamino)-2-[(4-methylphenyl) methyl]-1-[4-(4-morpholinyl) phenyl]-1-butanone (product name: IRGACURE 379EG, manufactured by BASF Japan Ltd.), 2-methyl-1-(4-methylthiophenyl)-2-morpholinopropan-1-one (product name: IRGACURE 907, manufactured by BASF Japan Ltd.), 2-hydroxy-1-{4-[4-(2-hydroxy-2-methyl-propionyl)-benzyl] phenyl}-2-methyl-propan-1-one (product name: IRGACURE 127, manufactured by BASF Japan Ltd.), 2-benzyl-2-dimethylamino-1-(4-morpholino-phenyl)-butanone-1 (product name: IRGACURE 369, manufactured by BASF Japan Ltd.), 2-hydroxy-2-methyl-1-phenyl-propan-1-one (product name: IRGACURE 1173, manufactured by BASF Japan Ltd.), 1-hydroxy-cyclohexylphenyl-ketone (product name: IRGACURE 184, manufactured by BASF Japan Ltd.), 2,2-dimethoxy-1,2-diphenylethan-1-one (product name: IRGACURE 651, manufactured by BASF Japan Ltd.), and a product name of an oxime ester type (product name: Lunar 6, manufactured by DKSH Management Ltd.).

A content of the radical polymerization initiator in the photosensitive composition of the embodiment is not particularly limited.

The content of the radical polymerization initiator is preferably equal to or greater than 0.1% by mass, more preferably equal to or greater than 0.5% by mass, and even more preferably equal to or greater than 1.0% by mass with respect to the amount of solid contents of the photosensitive composition.

In addition, the content of the radical polymerization initiator is preferably equal to or smaller than 10% by mass and more preferably equal to or smaller than 5% by mass, with respect to the amount of solid contents of the photosensitive composition.

<Radical Polymerizable Monomer>

The photosensitive composition of the embodiment preferably includes at least one kind of the radical polymerizable monomer, from a viewpoint of further improving hardness of the cured film.

The radical polymerizable monomer preferably includes di- or higher functional radical polymerizable monomer.

Here, the radical polymerizable monomer means a monomer including a radical polymerizable group in one molecule, and the di- or higher functional radical polymerizable monomer means a monomer including two or more radical polymerizable groups in one molecule.

The radical polymerizable group is preferably an ethylenically unsaturated group (that is, group including an ethylenically double bond), and is more preferably a (meth)acryloyl group.

The radical polymerizable monomer is preferably (meth)acrylate.

The photosensitive composition of the embodiment particularly preferably includes a difunctional radical polymerizable monomer (preferably, difunctional (meth)acrylate) and tri- or higher functional radical polymerizable monomer (preferably, tri- or higher functional (meth)acrylate), from a viewpoint of improving the saline heat moisture resistance of the cured film.

The difunctional radical polymerizable monomer is not particularly limited and suitably selected from well-known compounds.

Examples of the difunctional radical polymerizable monomer include tricyclodecane dimethanol di(meth)acrylate, tricyclodecanedimananol di(meth)acrylate, 1,9-nonanediol di(meth)acrylate, and 1,6-hexanediol di(meth)acrylate.

More specific examples of the difunctional radical polymerizable monomer include tricyclodecanedimethanol diacrylate (A-DCP, manufactured by Shin-Nakamura Chemical Co., Ltd.), tricyclodecanedimenanol dimethacrylate (DCP, manufactured by Shin-Nakamura Chemical Co., Ltd.), 1,9-nonanediol diacrylate (A-NOD-N, manufactured by Shin-Nakamura Chemical Co., Ltd.), and 1,6-hexanediol diacrylate (A-HD-N, manufactured by Shin-Nakamura Chemical Co., Ltd.).

The tri- or higher functional radical polymerizable monomer is not particularly limited and can be suitably selected from well-known compounds.

Examples of the tri- or higher functional radical polymerizable monomer include dipentaerythritol (tri/tetra/penta/hexa) (meth)acrylate, pentaerythritol (tri/tetra) (meth)acrylate, trimethylolpropane tri(meth)acrylate, ditrimethylolpropane tetra(meth)acrylate, isocyanuric acid (meth)acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth)acrylate and tetra(meth)acrylate.

Examples of the radical polymerizable monomer include a caprolactone-modified compound of a (meth)acrylate compound (KAYARAD (registered trademark) DPCA-20 manufactured by Nippon Kayaku Co., Ltd., A-9300-1CL manufactured by Shin-Nakamura Chemical Co., Ltd.), an alkylene oxide-modified compound of a (meth)acrylate compound (KAYARAD RP-1040 manufactured by Nippon Kayaku Co., Ltd., ATM-35E, A-9300 manufactured by Shin-Nakamura Chemical Co., Ltd., EBECRYL (registered trademark) 135 manufactured by Daicel-Allnex Ltd.), and ethoxylated glycerin triacrylate (A-GLY-9E manufactured by Shin-Nakamura Chemical Co., Ltd.).

As the radical polymerizable monomer, urethane (meth)acrylate (preferably tri- or higher functional urethane (meth)acrylate) is also used.

Examples of the tri- or higher functional urethane (meth)acrylate include 8UX-015A (manufactured by Taisei Fine Chemical Co., Ltd.), UA-32P (manufactured by Shin-Nakamura Chemical Co., Ltd.), and UA-1100H (manufactured by Shin-Nakamura Chemical Co., Ltd.).

the radical polymerizable monomer preferably includes a polymerizable monomer including an acid group, from viewpoints of improving alkali solubility (that is, improving developability) and improving saline heat moisture resistance of the cured film.

Examples of the acid group include a phosphoric acid group, a sulfonic acid group, and a carboxyl group, and a carboxyl group is preferable.

Examples of the radical polymerizable monomer including the acid group include tri- or tetra-functional radical polymerizable monomer including the acid group (component obtained by introducing a carboxylic acid group to pentaerythritol tri- and tetra-acrylate [PETA] skeleton (acid value=80 to 120 mgKOH/g)), and penta- to hexa-functional radical polymerizable monomer including the acid group (component obtained by introducing a carboxylic acid group to dipentaerythritol penta- and hexa-acrylate [DPHA] skeleton (acid value=25 to 70 mgKOH/g)).

The tri- or higher functional radical polymerizable monomer including the acid group may be used in combination with the difunctional radical polymerizable monomer including the acid group, if necessary.

As the radical polymerizable monomer including the acid group, at least one kind selected from the group consisting of di- or higher functional radical polymerizable monomer including a carboxyl group and a carboxylic acid anhydride thereof is preferable. Accordingly, the saline heat moisture resistance of the cured film increases.

The di- or higher functional radical polymerizable monomer including a carboxyl group is not particularly limited and can be suitably selected from well-known compounds.

For example, as the di- or higher functional radical polymerizable monomer including a carboxyl group, ARONIX (registered trademark) TO-2349 (manufactured by Toagosei Co., Ltd.), ARONIX M-520 (manufactured by Toagosei Co., Ltd.), or ARONIX M-510 (manufactured by Toagosei Co., Ltd.) can be preferably used.

The radical polymerizable monomer including the acid group is also preferably a polymerizable compound including an acid group disclosed in paragraphs 0025 to 0030 of JP2004-239942A. The content of this publication is incorporated in this specification.

A weight-average molecular weight (Mw) of the radical polymerizable monomer which can be included in the photosensitive composition of the embodiment is preferably 200 to 3,000, more preferably 250 to 2,600, and even more preferably 280 to 2,200.

In a case where the photosensitive composition of the embodiment includes the radical polymerizable monomer, a molecular weight of the radical polymerizable monomer having the minimum molecular weight, among all of the radical polymerizable monomers included in the photosensitive composition, is preferably equal to or greater than 250, more preferably equal to or greater than 280, and even more preferably equal to or greater than 300.

In a case where the photosensitive composition of the embodiment includes the radical polymerizable monomer, a percentage of the content of the radical polymerizable monomer having a molecular weight equal to or smaller than 300, among all of the radical polymerizable monomers included in the photosensitive composition, with respect to all of the polymerizable compounds included in the photosensitive composition, is preferably equal to or smaller than 30% by mass, more preferably equal to or smaller than 25% by mass, and even more preferably equal to or smaller than 20% by mass.

In a case where the photosensitive composition of the embodiment includes the radical polymerizable monomer, the content of the radical polymerizable monomer is preferably 1% by mass to 70% by mass, more preferably 10% by mass to 70% by mass, even more preferably 20% by mass to 60% by mass, and particularly preferably 20% by mass to 50% by mass with respect to the amount of solid contents of the photosensitive composition.

In addition, in a case where the photosensitive composition of the embodiment includes difunctional radical polymerizable monomer and the tri- or higher functional radical polymerizable monomer, the content of the difunctional radical polymerizable monomer is preferably 10% by mass to 90% by mass, more preferably 20% by mass to 85% by mass, and even more preferably 30% by mass to 80% by mass, with respect to all of the radical polymerizable monomers included in the photosensitive composition.

In this case, the content of the tri- or higher functional radical polymerizable monomer is preferably 10% by mass to 90% by mass, more preferably 15% by mass to 80% by mass, and even more preferably 20% by mass to 70% by mass, with respect to all of the radical polymerizable monomers included in the photosensitive composition.

In this case, the content of the di- or higher functional radical polymerizable monomer is preferably equal to or greater than 50% by mass and smaller than 100% by mass, more preferably 60% by mass to 95% by mass, and particularly preferably 70% by mass to 95% by mass, with respect to a total content of the difunctional radical polymerizable monomer and the tri- or higher functional radical polymerizable monomer.

In a case where the photosensitive composition of the embodiment includes the di- or higher functional radical polymerizable monomer, the photosensitive composition may further include a monofunctional radical polymerizable monomer.

However, in a case where the photosensitive composition of the embodiment includes the di- or higher functional radical polymerizable monomer, the di- or higher functional radical polymerizable monomer is preferably a main component in the radical polymerizable monomer included in the photosensitive composition.

Specifically, in a case where the photosensitive composition of the embodiment includes the di- or higher functional radical polymerizable monomer, the content of the di- or higher functional radical polymerizable monomer is preferably 60% by mass to 100% by mass, more preferably 80% by mass to 100% by mass, particularly preferably 90% by mass to 100% by mass with respect to a total content of the radical polymerizable monomer included in the photosensitive composition.

In a case where the photosensitive composition of the embodiment includes the radical polymerizable monomer including the acid group (preferably, di- or higher functional radical polymerizable monomer including a carboxyl group or a carboxylic acid anhydride thereof), the content of the radical polymerizable monomer including the acid group is preferably 1% by mass to 50% by mass, more preferably 1% by mass to 20% by mass, and even more preferably 1% by mass to 10% by mass, with respect to the amount of solid contents of the photosensitive composition.

In the photosensitive composition of the embodiment, a content mass ratio of the radical polymerizable monomer with respect to the polymer (P) (radical polymerizable monomer/polymer (P)) is preferably equal to or smaller than 1.5, more preferably 0.1 to 1.5, even more preferably 0.5 to 1.5, still more preferably 0.8 to 1.5, and particularly preferably 1.0 to 1.4.

<Compound Including Two or More Thermal Reactive Groups in One Molecule (Thermal Crosslinking Compound)>

The photosensitive composition of the embodiment preferably includes a compound including two or more thermal reactive groups in one molecule, from a viewpoint of further decreasing the WVTR of the cured film.

The compound including two or more thermal reactive groups in one molecule is reacted with heat to form a crosslinked structure. Hereinafter, the compound including two or more thermal reactive groups in one molecule is also referred to as a "thermal crosslinking compound".

In a case where the photosensitive composition of the embodiment includes the thermal crosslinking compound, the photosensitive composition does not only have photosensitivity (that is, photocuring properties), but also has thermosetting properties.

In a case where the photosensitive composition of the embodiment has both photocuring properties and thermosetting properties, a cured film having excellent hardness can be formed by photocuring, and the hardness of the cured film can be further improved and the WVTR of the cured film can be further decreased by heat curing after forming the cured film.

The thermal reactive group of the thermal crosslinking compound is preferably at least one kind selected from the group consisting of an isocyanate group, a ketene group, a blocked isocyanate group, and a blocked ketene group, from a viewpoint of further decreasing the WVTR of the cured film.

That is, the thermal crosslinking compound particularly preferably includes two or more thermal reactive groups which are at least one kind selected from the group consisting of an isocyanate group, a ketene group, a blocked isocyanate group, and a blocked ketene group, in one molecule. An upper limit of the number of the thermal reactive group in one molecule is not particularly limited, and the number of the thermal reactive groups in one molecule can be, for example, equal to or smaller than 30 and is more preferably equal to or smaller than 10.

The thermal crosslinking compound may include a hydrophilic group in one molecule.

Since the thermal crosslinking compound includes a hydrophilic group in one molecule, developability is improved.

The thermal crosslinking compound including a hydrophilic group in one molecule is not particularly limited and well-known compounds can be used.

A synthesis method of the thermal crosslinking compound including a hydrophilic group in one molecule is not particularly limited, either.

As the hydrophilic group of the thermal crosslinking compound including a hydrophilic group in one molecule, a nonionic hydrophilic group or a cationic hydrophilic group is preferable.

The nonionic hydrophilic group is not particularly limited, and a group having a structure in which ethylene oxide or propylene oxide is added to a hydroxyl group of any alcohol of methanol, ethanol, butanol, ethylene glycol, and diethylene glycol is used, for example.

The thermal crosslinking compound may be a compound which reacts with acid due to heat.

The thermal crosslinking compound which is a compound reacting with acid due to heat, reacts with an acid group (for example, acid group in the polymer (P), in a case where the polymer (P) includes the acid group-containing unit) present in a system due to heating. Accordingly, polarity in the system decreases, and therefore, hydrophilicity decreases.

As the thermal crosslinking compound which is a compound reacting with acid due to heat, a compound which includes a group temporarily inactivated due to a blocking agent (for example, a blocked isocyanate group, a blocked ketene group, and the like) as a thermal reactive group and which can react with acid by dissociating a blocking agent-derived group at a predetermined dissociation temperature is preferable.

The thermal crosslinking compound which is a thermal crosslinking compound due to heat is preferably a compound having higher reactivity with acid after heating at a temperature higher than 25° C., compared to reactivity with acid at 25° C. is preferable.

The thermal crosslinking compound which is a compound reacting with acid due to heat is particularly preferably a compound including a blocked isocyanate group (hereinafter, "blocked isocyanate compound") or a compound including a blocked ketene group (hereinafter, "blocked ketene compound").

According to this aspect, in a case of a protective film which protects the electrode (metal or a metal compound) with the photosensitive composition, rust of the electrode due to the thermal crosslinking compound is prevented.

(Blocked Isocyanate Compound)

The blocked isocyanate compound is preferably a compound having a structure which protects (masks) an isocyanate group of an isocyanate compound (that is, compound including an isocyanate group) with a blocking agent.

The blocked isocyanate compound preferably includes a hydrophilic group in one molecule. The preferred aspect of the hydrophilic group is as described above.

A dissociation temperature of the blocked isocyanate compound is preferably 100° C. to 160° C. and more preferably 130° C. to 150° C.

Here, the dissociation temperature of the blocked isocyanate compound is a "temperature of an endothermic peak accompanied with a deprotection reaction of blocked isocyanate, in a case where the measurement is performed by differential scanning calorimetry (DSC) analysis using a differential scanning calorimetry (manufactured by Seiko Instruments Inc., DSC 6200)".

Examples of the blocking agent for forming the blocked isocyanate compound (for example, blocked isocyanate compound having a dissociation temperature of 100° C. to 160° C.) include a pyrazole based compound (3,5-dimethylpyrazole, 3-methylpyrazole, 4-bromo-3,5-dimethylpyrazole, or 4-nitro-3,5-dimethylpyrazole), an active methylene based compound (malonic acid diester (dimethyl malonate, diethyl malonate, di n-butyl malonate, di 2-ethylhexyl malonate)), a triazole based compound (1,2,4-triazole), an oxime compound (compound having a structure represented by —C(=N—OH)— in one molecule; for example, formaldoxime, acetoaldoxime, acetoxime, methyl ethyl ketoxime, or cyclohexanone oxime).

Among these, from a viewpoint of storage stability, an oxime based compound and a pyrazole based compound are preferable, and an oxime based compound is more preferable.

From a viewpoint of improving toughness of the cured film and adhesiveness of a base material, the blocked isocyanate compound preferably has an isocyanurate structure.

The blocked isocyanate compound having an isocyanurate structure is, for example, synthesized by isocyanurating hexamethylene diisocyanate.

Among the blocked isocyanate compound having an isocyanurate structure, the compound having an oxime structure using the oxime compound as the blocking agent is preferable, compared to a compound not having an oxime structure, because the dissociation temperature is easily controlled to be in a preferred range and a development residue is easily decreased.

As the blocked isocyanate compound, a blocked isocyanate compound disclosed in paragraphs 0074 to 0085 of JP2006-208824A may be used, and the content of this publication is incorporated in the specification.

Specific examples of the blocked isocyanate compound include the following compounds. However, the blocked isocyanate compound is not limited to the following compounds. In the structure of the following compounds, "*" shows a bonding site.

Specific examples of the blocking agent for forming the blocked ketene compound are the same as the specific examples of the blocking agent for forming the blocked isocyanate compound.

More specific examples of the blocked ketene compound include a compound having a naphthoquinone diazide structure, and a compound having a Meldrum's acid structure.

Examples of the blocked ketene compound include naphthoquinone diazide sulfonic acid ester of 4-{4-[1,1-bis

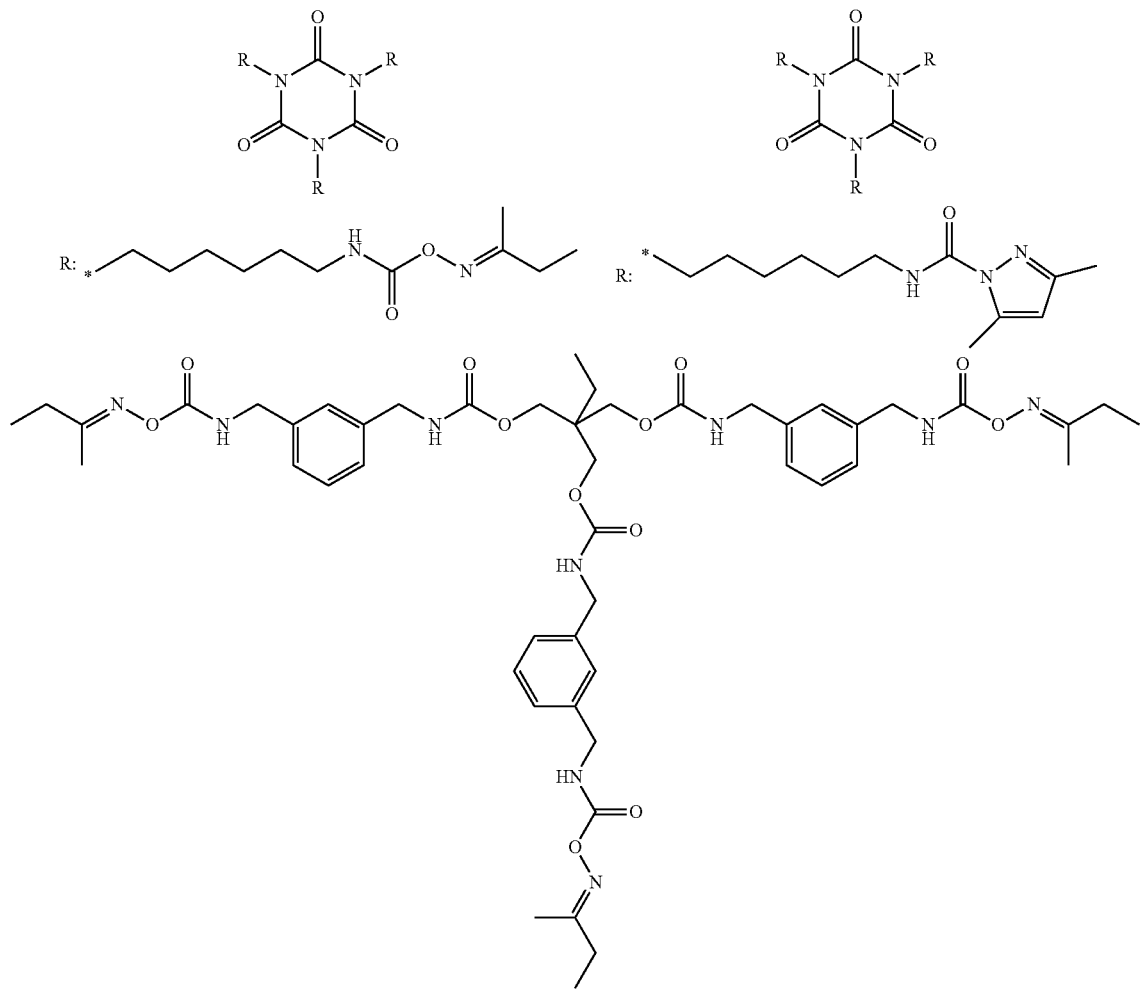

As the blocked isocyanate compound, a commercially available product may be used.

Examples of the commercially available product of the blocked isocyanate compound include TAKENATE (registered trademark) b870N (manufactured by Mitsui Chemicals, Inc.) which is a methyl ethyl ketone oxime blocked body of isophorone diisocyanate, and DURANATE (registered trademark) MF-K60B, TPA-B80E, and X3071.04 (all manufactured by Asahi Kasei Corporation) which is a hexamethylene diisocyanate-based blocked isocyanate compound.

(Blocked Ketene Compound)

Examples of the blocked ketene compound include a compound having a structure in which a ketene group of a ketene compound (that is, a compound including a ketene group) is protected with a blocking agent, and a compound in which a ketene group is generated due to light or heat.

(4-hydroxyphenyl) ethyl]-α,α-dimethylbenzyl}phenol, and naphthoquinone diazide sulfonic acid ester of 2,3,4-trihydroxybenzophenone.

As the blocked ketene compound, a commercially available product may be used.

Examples of the commercially available product of the blocked ketene compound include TAS-200 manufactured by Toyo Gosei Co., Ltd. which is naphthoquinone diazide sulfonic acid ester of 4-{4-[1,1-bis (4-hydroxyphenyl) ethyl]-α,α-dimethylbenzyl}phenol. In addition, naphthoquinone diazide sulfonic acid ester of 2,3,4-trihydroxybenzophenone can also be purchased.

In a case where the photosensitive composition of the embodiment includes the thermal crosslinking compound (for example, the blocked isocyanate compound or the blocked ketene compound), a content of the thermal crosslinking compound is preferably 1% by mass to 50% by mass, more preferably 5% by mass to 30% by mass, even more preferably 10% by mass to 30% by mass, and particularly preferably 15% by mass to 30% by mass, with respect to the amount of solid contents of the photosensitive composition.

<Solvent>

The photosensitive composition of the embodiment may include at least one kind of a solvent, from a viewpoint of forming a photosensitive layer by coating.

As the solvent, a solvent normally used can be used without particular limitations.

The solvent is preferably an organic solvent.

Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol. The photosensitive composition of the embodiment may include a mixed solvent which is a mixture of these compounds.

As the solvent, a mixed solvent of methyl ethyl ketone and propylene glycol monomethyl ether acetate, or a mixed solvent of diethylene glycol ethyl methyl ether and propylene glycol monomethyl ether acetate is preferable.

In a case where the photosensitive composition of the embodiment includes the solvent, a content of solid contents of the photosensitive composition of the embodiment is preferably 5% by mass to 80% by mass, more preferably 5% by mass to 40% by mass, and particularly preferably 5% by mass to 30% by mass with respect to a total amount of the photosensitive composition.

In a case where the photosensitive composition of the embodiment includes the solvent, a viscosity (25° C.) of the photosensitive composition is preferably 1 mPa·s to 50 mPa·s, more preferably 2 mPa·s to 40 mPa·s, and particularly preferably 3 mPa·s to 30 mPa·s, from a viewpoint of coating properties.

The viscosity is, for example, measured using VISCOMETER TV-22 (manufactured by TOKI SANGYO CO. LTD.).

In a case where the photosensitive composition of the embodiment includes the solvent, a surface tension (25° C.) of the photosensitive composition is preferably 5 mN/m to 100 mN/m, more preferably 10 mN/m to 80 mN/m, and particularly preferably 15 mN/m to 40 mN/m, from a viewpoint of coating properties.

The surface tension is, for example, measured using Automatic Surface Tensiometer CBVP-Z (manufactured by Kyowa Interface Science Co., Ltd.).

As the solvent, a solvent disclosed in paragraphs 0054 and 0055 of US2005/282073A1 can also be used, and the content of this specification is incorporated in the present specification.

In addition, as the solvent, an organic solvent (high-boiling-point solvent) having a boiling point of 180° C. to 250° C. can also be used, if necessary.

<Other Components>

The photosensitive composition of the embodiment may include a component other than the components described above.

Examples of the other components include a metal oxidation suppressing agent which will be described later, a surfactant disclosed in a paragraph 0017 of JP4502784B and paragraphs 0060 to 0071 of JP2009-237362A, a well-known fluorine-based surfactant, a thermal polymerization inhibitor disclosed in a paragraph 0018 of JP4502784B, and other additives disclosed in paragraphs 0058 to 0071 of JP2000-310706.

The photosensitive composition of the embodiment preferably includes MEGAFACE F-551 (manufactured by DIC Corporation) which is a fluorine-based surfactant as the other component.

The photosensitive composition of the embodiment may include at least one kind of particles (for example, metal oxide particles) as the other component, in order to adjust a refractive index or light transmittance.

The metal of the metal oxide particles also includes semimetal such as B, Si, Ge, As, Sb, or Te. From a viewpoint of transparency of the cured film, an average primary particle diameter of the particles (for example, metal oxide particles) is preferably 1 to 200 nm and more preferably 3 to 80 nm. The average primary particle diameter is calculated by measuring particle diameters of 200 random particles using an optical microscope and averaging the measured result. In a case where the shape of the particle is a spherical shape, the longest side is set as the particle diameter.

The content of the particles is preferably 0% by mass to 35% by mass, more preferably 0% by mass to 10% by mass, even more preferably 0% by mass to 5% by mass, still more preferably 0% by mass to 1% by mass, and particularly preferably 0% by mass (that is, the photosensitive composition includes no particles), with respect to the amount of solid contents of the photosensitive composition.

In addition, the photosensitive composition of the embodiment may include a small amount of colorant (pigment, dye, and the like) as the other component, but it is preferable that a colorant is not substantially included, from a viewpoint of transparency.

Specifically, a content of the colorant in the photosensitive composition of the embodiment is preferably smaller than 1% by mass and more preferably smaller than 0.1% by mass with respect to the amount of solid contents of the photosensitive composition.

[Transfer Film]

A transfer film of the embodiment includes a temporary support, and a photosensitive layer including solid contents of the photosensitive composition of the embodiment.

The transfer film of the embodiment is suitable for forming a cured film on a base material. In a case of forming the cured film on the base material using the transfer film of the embodiment, the cured film is formed on the base material, by transferring a photosensitive layer of the transfer film of the embodiment to the base material to be formed as the cured film, and performing processes of exposure and development with respect to the photosensitive layer transferred onto the base material.

According to the transfer film of the embodiment, the same effect as the effect of the photosensitive composition of the embodiment, that is, the effect of forming the cured film having a decreased WVTR is exhibited.

Accordingly, the transfer film of the embodiment is particularly suitable for forming a protective film for a touch panel as the cured film.

The photosensitive layer of the transfer film includes solid contents of the photosensitive composition of the embodiment.

That is, in a case where the photosensitive composition of the embodiment includes the solvent, the photosensitive layer of the transfer film at least includes components (that is, solid contents) other than the solvent of the photosensitive composition. In this case, the photosensitive layer may further include a solvent. As a case where the photosensitive layer includes the solvent, a case where the solvent remains in the photosensitive layer even after drying, in a case of forming the photosensitive layer by applying and drying the photosensitive composition including the solvent, is used, for example.

In addition, in a case where the photosensitive composition of the embodiment does not include the solvent, the photosensitive layer of the transfer film includes all components of the photosensitive composition.

The transfer film of the embodiment preferably further includes a layer of high refractive index, having a refractive index equal to or greater than 1.50 (more preferably equal to or greater than 1.55, and particularly preferably equal to or greater than 1.60) at a wavelength of 550 nm, on a side of the photosensitive layer opposite to the side where the temporary support is present.

In this aspect, in a case where the protective film for a touch panel is formed by transferring photosensitive layer and the layer of high refractive index of the transfer film to the substrate for a touch panel including a transparent electrode pattern (for example, a transparent electrode pattern formed of indium tin oxide (ITO)), the transparent electrode pattern is more hardly recognized (that is, concealing properties of the transparent electrode pattern are further improved).

The layer of high refractive index is not particularly limited, as long as a layer having a refractive index at a wavelength of 550 nm equal to or greater than 1.50.

Regarding the phenomenon that the transparent electrode pattern is recognized, and the concealing properties of the transparent electrode pattern, JP2014-010814A and JP2014-108541A can be suitably referred to.

In the specification, the "refractive index" means a value measured with visible light at a wavelength of 550 nm at a temperature of 23° C. by ellipsometry, unless otherwise noted.

From a viewpoint of easily adjusting the refractive index to be equal to or greater than 1.50 (more preferably equal to or greater than 1.55, and particularly preferably equal to or greater than 1.60), the layer of high refractive index preferably includes at least one kind selected from the group consisting of inorganic particles having a refractive index equal to or greater than 1.50 (more preferably equal to or greater than 1.55, and particularly preferably equal to or greater than 1.60), a polymer compound having a refractive index equal to or greater than 1.50 (more preferably equal to or greater than 1.55, and particularly preferably equal to or greater than 1.60), and a polymerizable monomer having a refractive index equal to or greater than 1.50 (more preferably equal to or greater than 1.55, and particularly preferably equal to or greater than 1.60).

FIG. 1 is a schematic cross sectional view showing a transfer film 10 which is an example of the transfer film of the embodiment.

As shown in FIG. 1, the transfer film 10 has a laminated structure of protective film 16/layer of high refractive index 20A/photosensitive layer 18A/temporary support 12 (that is, laminated structure in which a temporary support 12, a photosensitive layer 18A, a layer of high refractive index 20A, and a protective film 16 are laminated in this order).

However, the transfer film of the embodiment is not limited to the transfer film 10, and the layer of high refractive index 20A and the protective film 16 may be omitted, for example. In addition, at least one of a thermoplastic resin layer or an interlayer which will be described later may be included between the temporary support 12 and the photosensitive layer 18A.

The photosensitive layer 18A is a layer including solid contents of the photosensitive composition of the embodiment.

The layer of high refractive index 20A is a layer disposed on a side of the photosensitive layer 18A opposite to the side where the temporary support 12 is present, and a layer having a refractive index at a wavelength of 550 nm equal to or greater than 1.50.

The transfer film 10 is a negative type material (negative type film).

A manufacturing method of the transfer film 10 is not particularly limited.

The manufacturing method of the transfer film 10, for example, includes a step of forming the photosensitive layer 18A on the temporary support 12, a step of forming the layer of high refractive index 20A on the photosensitive layer 18A, and a step of forming the protective film 16 on the layer of high refractive index 20A in this order.

The manufacturing method of the transfer film 10 may include a step of volatilizing ammonia disclosed in a paragraph 0056 of WO2016/009980, between the step of forming the layer of high refractive index 20A and the step of forming the protective film 16.

Hereinafter, each component which can be included in the transfer film of the embodiment will be described.

<Temporary Support>

The transfer film of the embodiment includes a temporary support (for example, the temporary support 12).

The temporary support is preferably a film and more preferably a resin film.

As the temporary support, a film which has flexibility and does not generate significant deformation, shrinkage, or stretching under the pressure or under pressure and heating can be used.

Examples of such a film include a polyethylene terephthalate film, a cellulose triacetate film, a polystyrene film, a polyimide film, and a polycarbonate film.

Among these, a biaxial stretching polyethylene terephthalate film is particularly preferable.

A thickness of the temporary support is not particularly limited, and is, for example, 5 μm to 200 μm. The thickness of the temporary support is particularly preferably 10 μm to 150 μm, from viewpoints of ease of handling and general-purpose properties.

<Photosensitive Layer>

The transfer film of the embodiment includes a photosensitive layer (for example, photosensitive layer 18A) including solid contents of the photosensitive composition of the embodiment.

The photosensitive layer has photosensitivity (that is, photocuring properties), and may further have thermosetting properties. Examples of means for applying thermosetting properties to the photosensitive layer include means for causing the thermal crosslinking compound described above to be included in the photosensitive composition of the embodiment. In a case where the photosensitive layer has both photocuring properties and thermosetting properties, hardness of the cured film can be further improved and the WVTR of the cured film can be further decreased.

The photosensitive layer preferably further has alkali solubility (for example, solubility with respect to weak alkali aqueous solution). Examples of means for applying alkali solubility to the photosensitive layer include means for causing the acid group-containing unit described above to be included in the polymer (P).

In addition, the photosensitive layer is preferably a transparent layer. Examples of means for setting the photosensitive layer as the transparent layer include means for setting the content of the colorant in the photosensitive composition of the embodiment to be smaller than 1% by mass.

A film thickness of the photosensitive layer is preferably 1 jam to 20 μm, more preferably 2 jam to 15 μm, and more preferably 3 jam to 12 am.

By setting the film thickness of the photosensitive layer to be in the range described above, light transmittance hardly decreases.

By setting the film thickness of the photosensitive layer to be in the range described above, the photosensitive layer hardly absorbs a radio wave at a wavelength of 10 nm to 100 nm (short wave) and the photosensitive layer is prevented from being stained into yellow.

A refractive index of the photosensitive layer (that is, refractive index measured with visible light at a wavelength of 550 nm at a temperature of 23° C. by ellipsometry) is preferably 1.47 to 1.56, more preferably 1.50 to 1.53, even more preferably 1.50 to 1.52, and particularly preferably 1.51 to 1.52.

A method of controlling the refractive index of the photosensitive layer is not particularly limited.

As the method of controlling the refractive index of the photosensitive layer, a method of selecting the polymer (P) having a desired refractive index, a method of controlling the refractive index by adding metal oxide particles or metal particles, and a method of controlling the refractive index using a composite of metal salt and the polymer (P) are used, for example.

The photosensitive layer is preferably applied to an image display portion of a touch panel, and in this case, the photosensitive layer preferably has high transparency and high transmittance.

A forming method of the photosensitive layer is not particularly limited.

As an example of the forming method of the photosensitive layer, a method of forming the photosensitive layer by applying and, if necessary, drying the photosensitive composition of the embodiment having an aspect of including the solvent, on the temporary support is used.

As the coating method, a well-known method can be used, and examples thereof include a printing method, a spraying method, a roll coating method, a bar coating method, a curtain coating method, a spin coating method, and a die coating method (that is, slit coating method), and a die coating method is preferable.

As the drying method, a well-known method such as natural drying, heating drying, and drying under reduced pressure can be applied alone or in combination of plural thereof.

<Layer of High Refractive Index>

The transfer film of the embodiment preferably further includes a layer of high refractive index (for example, the layer of high refractive index 20A) having a refractive index at a wavelength of 550 nm equal to or greater than 1.50, on a side of the photosensitive layer opposite to the temporary support.

The layer of high refractive index is preferably disposed to be adjacent to the photosensitive layer, as shown in FIG. 1.

The layer of high refractive index is not particularly limited, as long as it is a layer having refractive index at a wavelength of 550 nm equal to or greater than 1.50.

The refractive index of the layer of high refractive index is preferably equal to or greater than 1.55 and more preferably equal to or greater than 1.60.

An upper limit of the refractive index of the layer of high refractive index is not particularly limited, and is preferably equal to or smaller than 2.10, more preferably equal to or smaller than 1.85, even more preferably equal to or smaller than 1.78, and particularly preferably equal to or smaller than 1.74.

The layer of high refractive index may have photocuring properties (that is, photosensitivity), may have thermosetting properties, or may have both photocuring properties and thermosetting properties.

From a viewpoint of forming the cured film having excellent hardness by the photocuring after the transfer, the layer of high refractive index preferably has photocuring properties.

From viewpoints of further improving hardness of the cured film and further decreasing the WVTR of the cured film by the heat curing, the layer of high refractive index preferably has thermosetting properties.

The layer of high refractive index preferably has thermosetting properties and photocuring properties.

The layer of high refractive index preferably has alkali solubility (for example, solubility with respect to weak alkali aqueous solution).

In addition, the layer of high refractive index is preferably a transparent layer.

The aspect in which the layer of high refractive index has photosensitivity, has an advantage, from a viewpoint of collectively patterning the photosensitive layer and the layer of high refractive index transferred onto the base material by photolithography at one time, after the transferring.

A film thickness of the layer of high refractive index is preferably equal to or smaller than 500 nm, more preferably equal to or smaller than 110 nm, and particularly preferably equal to or smaller than 100 nm.

In addition, the film thickness of the layer of high refractive index is preferably equal to or greater than 20 nm, more preferably equal to or greater than 55 nm, even more preferably equal to or greater than 60 nm, and particularly preferably equal to or greater than 70 nm.

The film thickness of the layer of high refractive index is more preferably 55 nm to 100 nm, even more preferably 60 nm to 100 nm, and particularly preferably 70 nm to 100 nm.

The refractive index of the layer of high refractive index is equal to or greater than 1.50 (more preferably equal to or greater than 1.55, and particularly preferably equal to or greater than 1.60) and is preferably higher than the refractive index of the photosensitive layer.

The layer of high refractive index is interposed between the transparent electrode pattern (preferably ITO pattern) and the photosensitive layer after the transfer, and accordingly, a laminate (for example, touch panel 30 in FIG. 2) may be formed together with the transparent electrode pattern and the photosensitive layer. In this case, by decreasing a refractive index difference between the transparent electrode pattern and the layer of high refractive index and a refractive index difference between the layer of high refractive index and the photosensitive layer, light reflection is further decreased. Accordingly, the concealing properties of the transparent electrode pattern are further improved.

For example, in a case where the transparent electrode pattern, the layer of high refractive index, and the photosensitive layer are laminated in this order, the transparent electrode pattern is hardly recognized in a view of the transparent electrode pattern side.

The refractive index of the layer of high refractive index is preferably adjusted in accordance with the refractive index of the transparent electrode pattern.

In a case where the refractive index of the transparent electrode pattern is 1.8 to 2.0, as in a case where the transparent electrode pattern is formed using an oxide (ITO) of In and Sn, for example, the refractive index of the layer of high refractive index is preferably equal to or greater than 1.60. An upper limit of the refractive index of the layer of high refractive index in this case is not particularly limited, and is preferably equal to or smaller than 2.1, more preferably equal to or smaller than 1.85, even more preferably equal to or smaller than 1.78, and particularly preferably equal to or smaller than 1.74.

In a case where the refractive index of the transparent electrode pattern is greater than 2.0, as in a case where the transparent electrode pattern is formed using an oxide (indium zinc oxide (IZO)) of In and Zn, for example, the refractive index of the layer of high refractive index is preferably 1.70 to 1.85.

A method of controlling the refractive index of the layer of high refractive index is not particularly limited, and examples thereof include a method using a resin having a predetermined refractive index alone, a method using a resin and metal oxide particles and metal particles, and a method using a composite of metal salt and a resin.

The layer of high refractive index preferably includes at least one kind selected from the group consisting of inorganic particles having a refractive index equal to or greater than 1.50 (more preferably equal to or greater than 1.55, and particularly preferably equal to or greater than 1.60), a resin having a refractive index equal to or greater than 1.50 (more preferably equal to or greater than 1.55, and particularly preferably equal to or greater than 1.60), and a polymerizable monomer having a refractive index equal to or greater than 1.50 (more preferably equal to or greater than 1.55, and particularly preferably equal to or greater than 1.60).

According to this aspect, the refractive index of the layer of high refractive index is easily adjusted to be equal to or greater than 1.50 (more preferably equal to or greater than 1.55, and particularly preferably equal to or greater than 1.60).

Each preferred aspect of the inorganic particles having a refractive index equal to or greater than 1.50, the resin having a refractive index equal to or greater than 1.50, and the polymerizable monomer having a refractive index equal to or greater than 1.50 will be described later.

In addition, the layer of high refractive index preferably includes a binder polymer a polymerizable monomer, and particles.

Regarding the components of the layer of high refractive index, components of a curable transparent resin layer disclosed in paragraphs 0019 to 0040 and 0144 to 0150 of JP2014-108541A, and components of a transparent layer disclosed in paragraphs 0024 to 0035 and 0110 to 0112 of JP2014-010814A, and components of a composition including ammonium salt disclosed in paragraphs 0034 to 0056 of WO2016/009980 can be referred to.

In addition, the layer of high refractive index preferably includes at least one kind of a metal oxide suppressing agent.

In a case where the layer of high refractive index includes the metal oxide suppressing agent, surface treatment can be performed with respect to a member (for example, conductive member formed on a base material) in a direct contact with the layer of high refractive index, in a case of transferring the layer of high refractive index onto the base material (that is, a target to be transferred). This surface treatment applies a metal oxide suppressing function (protection properties) with respect to the member in a direct contact with the layer of high refractive index.

The metal oxide suppressing agent is preferably a compound having an "aromatic ring including nitrogen atoms". The compound having an "aromatic ring including nitrogen atoms" may include a substituent.

The "aromatic ring including nitrogen atoms" is preferably an imidazole ring, a triazole ring, a tetrazole ring, a thiazole ring, a thiadiazole ring, or a fused ring of any one thereof and another aromatic ring, and more preferably an imidazole ring, a triazole ring, a tetrazole ring, or a fused ring of any one thereof and another aromatic ring.

The "another aromatic ring" forming the fused ring may be a homocyclic ring or a heterocyclic ring, and is preferably a homocyclic ring, more preferably a benzene ring or a naphthalene ring, and even more preferably a benzene ring.

As the metal oxide suppressing agent, imidazole, benzimidazole, tetrazole, 5-amino-1H-tetrazole, mercaptothiadiazole, or benzotriazole is preferable, and imidazole, benzimidazole, 5-amino-1H-tetrazole, or benzotriazole is more preferable.

As the metal oxide suppressing agent, a commercially available product may be used, and as the commercially available product, BT 120 manufactured by Johoku Chemical Co., Ltd. including benzotriazole can be preferably used, for example.

In a case where the layer of high refractive index includes the metal oxide suppressing agent, a content of the metal oxide suppressing agent is preferably 0.1% by mass to 20% by mass, more preferably 0.5% by mass to 10% by mass, and even more preferably 1% by mass to 5% by mass with respect to the amount of solid contents of the layer of high refractive index.

The layer of high refractive index may include a component other than the component described above.

The other component which can be included in the layer of high refractive index is the same as the other component which can be included in the photosensitive composition of the embodiment.

The layer of high refractive index preferably includes a surfactant as the other component.

A forming method of the layer of high refractive index is not particularly limited.

As an example of the forming method of the layer of high refractive index, a method of forming the layer of high refractive index by applying and, if necessary, drying a composition for forming layer of high refractive index of the aspect including an aqueous solvent, on the photosensitive layer formed on the temporary support is used.

Specific examples of the coating and drying method are respectively the same as the specific examples of the coating and drying in a case of forming the photosensitive layer.

The composition for forming layer of high refractive index can include each component of the layer of high refractive index described above.

The composition for forming layer of high refractive index, for example, includes a binder polymer a polymerizable monomer, particles, and an aqueous solvent.

In addition, as the composition for forming layer of high refractive index, a composition including ammonium salt disclosed in paragraphs 0034 to 0056 of WO2016/009980 is also preferable.

<Protective Film>

The transfer film of the embodiment may further include a protective film (for example, the protective film 16 in FIG. 1) on a side of the photosensitive layer opposite to the temporary support.

In a case where the transfer film of the embodiment includes the layer of high refractive index, the protective film is preferably disposed on a side of the layer of high refractive index opposite to the temporary support (that is, side opposite to the photosensitive layer) (for example, see FIG. 1).

Examples of the protective film include a polyethylene terephthalate film, a polypropylene film, a polystyrene film, and a polycarbonate film.

As the protective film, a component disclosed in paragraphs 0083 to 0087 and 0093 of JP2006-259138A may be used, for example.

<Thermoplastic Resin Layer>

The transfer film of the embodiment may further include a thermoplastic resin layer (not shown) between a temporary support (for example, temporary support 12 in FIG. 1) and a photosensitive layer (for example, the photosensitive layer 18A in FIG. 1).

In a case where the transfer film includes the thermoplastic resin layer and the transfer film is transferred to a base material to form a laminate, air bubbles are hardly generated on each component of the laminate. In a case where this laminate is used in an image display device, image unevenness is hardly generated and excellent display properties are obtained.

The thermoplastic resin layer preferably has alkali solubility.

The thermoplastic resin layer functions as a cushion material which absorbs ruggedness of the surface of the base material at the time of transfer.

The ruggedness of the surface of the base material also includes an image, an electrode, a wiring, and the like which are formed in advance. The thermoplastic resin layer preferably has properties capable of being deformed in accordance with ruggedness.

The thermoplastic resin layer preferably includes an organic polymer substance disclosed in JP1993-72724A (JP-H5-72724A), and more preferably includes an organic polymer substance having a softening point approximately equal to or lower than 80° C. by a Vicat method (specifically, polymer softening point measurement method using a American Society for Testing and Materials ASTMD 1235).

A thickness of the thermoplastic resin layer is preferably 3 µm to 30 µm, more preferably 4 µm to 25 µm, and even more preferably 5 µm to 20 µm.

In a case where the thickness of the thermoplastic resin layer is equal to or greater than 3 µm, followability with respect to the ruggedness of the surface of the base material is improved, and accordingly, the ruggedness of the surface of the base material can be effectively absorbed.

In a case where the thickness of the thermoplastic resin layer is equal to or smaller than 30 µm, process suitability is further improved. For example, burden of the drying (solvent removal) in a case of applying and forming the thermoplastic resin layer on the temporary support is further reduced, and the development time of the thermoplastic resin layer after the transfer is shortened.

The thermoplastic resin layer can be formed by applying and, if necessary, drying a composition for forming a thermoplastic resin layer including a solvent and a thermoplastic organic polymer on the temporary support.

Specific examples of the coating and drying method are respectively the same as the specific examples of the coating and drying in a case of forming the photosensitive layer.

The solvent is not particularly limited, as long as a polymer component forming the thermoplastic resin layer is dissolved, and examples thereof include organic solvents (for example, methyl ethyl ketone, cyclohexanone, propylene glycol monomethyl ether acetate, n-propanol, and 2-propanol).

A viscosity of the thermoplastic resin layer measured at 100° C. is preferably 1,000 to 10,000 Pa·s. In addition, the viscosity of the thermoplastic resin layer measured at 100° C. is preferably lower than the viscosity of the photosensitive layer measured at 100° C.

<Interlayer>

The transfer film of the embodiment may further include an interlayer (not shown) between the temporary support (for example, the temporary support 12 in FIG. 1) and the photosensitive layer (for example, the photosensitive layer 18A in FIG. 1).

In a case where the transfer film of the embodiment includes the thermoplastic resin layer, the interlayer is preferably disposed between the thermoplastic resin layer and the photosensitive layer.

As the component of the interlayer, a resin which is a mixture including polyvinyl alcohol, polyvinyl pyrrolidone, cellulose, or at least two kinds thereof.

In addition, as the interlayer, a component disclosed in JP1993-72724A (JP-H5-72724A) as a "separation layer" can also be referred to.

In a case of manufacturing the transfer film of the aspect including the thermoplastic resin layer, the interlayer, and the photosensitive layer on the temporary support in this order, the interlayer can be, for example, formed by applying and, if necessary, drying a composition for forming an interlayer including a solvent which does not dissolve the thermoplastic resin layer, and the resin described above. Specific examples of the coating and drying method are respectively the same as the specific examples of the coating and drying in a case of forming the photosensitive layer.

In this case, for example, first, the composition for forming a thermoplastic resin layer is applied and dried on the temporary support to form the thermoplastic resin layer. Next, the composition for forming an interlayer is applied and dried on this thermoplastic resin layer to form the interlayer. After that, the photosensitive composition of the embodiment of the aspect including the organic solvent is applied and dried on the interlayer to form the photosensitive layer. The organic solvent in this case is preferably an organic solvent which does not dissolve the interlayer.

[Cured Film]

The cured film of the embodiment is a cured product of solid contents of the photosensitive composition of the embodiment.

That is, the cured film of the embodiment is a cured film having a decreased WVTR.

The cured film of the embodiment is not particularly limited, as long as it is a cured product of solid contents of the photosensitive composition of the embodiment, and is preferably a protective film for a touch panel.

The cured film of the embodiment can be formed on a base material.

In a case where the cured film of the embodiment is the protective film for a touch panel, a substrate for a touch panel having a structure in which at least one of an electrode for a touch panel or a wiring for a touch panel is disposed on the substrate (for example, a glass substrate or a resin substrate) is used, for example, as the base material.

A thickness of the cured film of the embodiment is not particularly limited, and is preferably 0.1 µm to 100 µm, more preferably 2 µm to 20 µm, and particularly preferably 4 µm to 10 am.

Generally, as the thickness of the film is thin, the WVTR of the film tends to increase.

However, even in a case where the thickness is thin (for example, thickness is equal to or smaller than 10 μm), the WVTR of the cured film of the embodiment is sufficiently decreased. Accordingly, the cured film of the embodiment is suitable for the protective film for a touch panel.

In addition, in a case where the thickness of the cured film of the embodiment is equal to or greater than 2 μm, the manufacturing suitability of the cured film are particularly excellent.

The method of manufacturing the cured film of the embodiment is not particularly limited, and the cured film of the embodiment can be manufactured by the following manufacturing method A, for example.

The manufacturing method A includes a step of forming a photosensitive layer on a base material using the photosensitive composition of the embodiment and the transfer film of the embodiment (hereinafter, also referred to as a "photosensitive layer forming step"), a step of performing pattern-exposure of the photosensitive layer formed on the base material (hereinafter, also referred to as an "exposure step"), and a step of developing the pattern-exposed photosensitive layer to form a cured film which is a cured product of solid contents of the photosensitive composition (hereinafter, also referred to as an "development step").

<Photosensitive Layer Forming Step>

In the photosensitive layer forming step of the manufacturing method A, a photosensitive layer is formed on a base material by using the photosensitive composition of the embodiment and the transfer film of the embodiment.

As the base material, a glass substrate or a resin substrate is preferable.

In addition, the base material is preferably a transparent substrate and more preferably a transparent resin substrate. The meaning of the transparency is as described above.

A refractive index of the base material is preferably 1.50 to 1.52.

As the glass substrate, tempered glass such as GORILLA GLASS (registered trademark) manufactured by Corning Incorporated can be used.

As the resin substrate, at least one of a component without optical strains or a component having high transparency is preferably used, and a substrate formed of a resin such as polyethylene terephthalate (PET), polyethylene naphthalate (PEN), polycarbonate (PC), triacetyl cellulose (TAC), polyimide (PI), polybenzoxazole (PBO), or cycloolefin polymer (COP) is used, for example.

As a material of the transparent substrate, a material disclosed in JP2010-86684A, JP2010-152809A, and JP2010-257492A is preferably used.

In addition, as the base material in the photosensitive layer forming step, a substrate for a touch panel having a structure in which at least one of the electrode for a touch panel or the wiring for a touch panel is disposed on the substrate (for example, the glass substrate or the resin substrate) can also be used.

In the photosensitive layer forming step, examples of the method of forming the photosensitive layer on the base material include a method using the transfer film of the embodiment, and a method using the photosensitive composition of the embodiment without using the transfer film of the embodiment.

Hereinafter, first, the method using the transfer film of the embodiment will be described.

In the method using the transfer film of the embodiment, the photosensitive layer is formed on the base material by laminating the transfer film of the embodiment on the base material and transferring the photosensitive layer of the transfer film of the embodiment onto the base material.

The laminating (transfer of the photosensitive layer) can be performed using a well-known laminator such as a vacuum laminator or an auto-cut laminator.

In a case of using the transfer film having a laminated structure of the protective film/photosensitive layer/interlayer/thermoplastic resin layer/temporary support, first, the protective film is peeled off from the transfer film to expose the photosensitive layer, the transfer film and the base material are bonded to each other so that the exposed photosensitive layer and the base material is in contact with each other, and the heating and pressurizing are performed. Accordingly, the photosensitive layer of the transfer film is transferred onto the base material, and a laminate of temporary support/thermoplastic resin layer/interlayer/photosensitive layer/base material is formed. After that, at least the temporary support is peeled off from the laminate, if necessary.

As an example of the method of transferring the photosensitive layer of the transfer film on the base material and performing pattern exposure and development, a description disclosed in paragraphs 0035 to 0051 of JP2006-23696A can also be referred to.

Next, the method of using the photosensitive composition of the embodiment without using the transfer film of the embodiment will be described.

As a suitable example of this method, the photosensitive composition of the embodiment of the aspect including the solvent is applied and dried on the base material to form the photosensitive layer on the base material.

Specific examples of the coating and drying method are respectively the same as the specific examples of the coating and drying in a case of forming the photosensitive layer on the temporary support. The heat treatment (so-called prebaking) may be performed with respect to the photosensitive layer after the drying and before the exposure, if necessary.

<Exposure Step>

The exposure step of the manufacturing method A is a step of performing the pattern exposure with respect to the photosensitive layer formed on the base material.

Here, the pattern exposure means exposure in a pattern shape.

The pattern exposure may be exposure through a mask or may be digital exposure using a laser or the like.

As a light source of the pattern exposure, a light source can be suitably selected, as long as it can emit light at a wavelength region (for example, 365 nm or 405 nm) at which the photosensitive layer can be cured. Examples of the light source include various lasers, an LED, an ultrahigh pressure mercury lamp, a high pressure mercury vapor lamp, and a metal halide lamp. An exposure intensity is, for example, approximately 5 J/cm$^2$ to 200 J/cm$^2$, and is preferably approximately 10 J/cm$^2$ to 100 J/cm$^2$.

In a case where the photosensitive layer is formed on the base material using the transfer film, the pattern exposure may be performed after peeling the temporary support, or the temporary support may be peeled off after performing the exposure before peeling off the temporary support.

In addition, in the exposure step, the heat treatment (so-called post exposure bake (PEB)) may be performed with respect to the photosensitive layer after the pattern exposure and before the development.

<Development Step>

The development step of the manufacturing method A is a step of obtaining the cured film which is a cured product of solid contents of the photosensitive composition by developing the pattern-exposed photosensitive layer.

A developer used in the development is not particularly limited, and a well-known developer such as a developer disclosed in JP1993-72724A (JP-H5-72724A) can be used.

As the developer, an alkali aqueous solution is preferably used.

Examples of the alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

The pH of the alkali aqueous solution at 25° C. is preferably 8 to 13, more preferably 9 to 12, and particularly preferably 10 to 12.

A content of the alkali compound in the alkali aqueous solution is preferably 0.1% by mass to 5% by mass and more preferably 0.1% by mass to 3% by mass with respect to a total amount of the alkali aqueous solution.

The developer may include an organic solvent having miscibility with water.

Examples of the organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and n-methylpyrrolidone. A concentration of the organic solvent is preferably 0.1% by mass to 30% by mass.

The developer may include a well-known surfactant. A concentration of the surfactant is preferably 0.01% by mass to 10% by mass.

A liquid temperature of the developer is preferably 20° C. to 40° C.

Examples of the development method include methods such as puddle development, shower development, shower and spin development, and dip development.

In a case of the shower development, an uncured portion is removed by spraying the developer to the photosensitive layer after the pattern exposure as a shower. In a case of using the transfer film including at least one of the photosensitive layer, the thermoplastic resin layer, and the interlayer, it is preferable that, after the transfer of these layers onto the base material and before the development of the photosensitive layer, an alkali solution having a low solubility of the photosensitive layer is sprayed as a shower, and at least one of the thermoplastic resin layer or the interlayer (both layers, in a case where both layers are present) is removed in advance.

In addition, after the development, the development residue is preferably removed by spraying a cleaning agent with a shower and rubbing with a brush or the like.

A liquid temperature of the developer is preferably 20° C. to 40° C.

The development step may include a stage of performing the development, and a stage of performing the heat treatment (hereinafter, also referred to as "post baking") with respect to the cured film obtained by the development.

In a case where the base material is a resin substrate, a temperature of the post baking is preferably 100° C. to 160° C. and more preferably 140° C. to 150° C.

For example, in a case of using a transparent electrode-attached substrate including a transparent electrode (for example, the electrode for a touch panel) such as ITO as the base material, a resistance value of the transparent electrode can also be adjusted by post baking.

In addition, in a case where the photosensitive layer includes a carboxyl group-containing acrylic resin, at least a part of the carboxyl group-containing acrylic resin can be changed to carboxylic anhydride by the post baking. Accordingly, the cured film having excellent saline heat moisture resistance is obtained.

In addition, the development step may include a stage of performing the development, and a stage of exposing the cured film obtained by the development (hereinafter, also referred to as "post exposure").

In a case where the development step includes a stage of performing the post exposure and a stage of performing the post baking, the post exposure and the post baking are preferably performed in this order.

Regarding the pattern exposure and the development, a description disclosed in paragraphs 0035 to 0051 of JP2006-23696A can be referred to, for example.

The manufacturing method A may include a step (for example, washing step or the like) other than the steps described above. As the other step, a step (for example, washing step or the like) which may be provided in a normal photolithography step can be applied without any particular limitations.

[Touch Panel]

The touch panel of the embodiment includes the cured film of the embodiment (that is, the cured film which is the cured product of solid contents of the photosensitive composition of the embodiment).

The preferred aspect of the touch panel of the embodiment is an aspect in which a substrate for a touch panel having a structure in which at least one of an electrode for a touch panel or a wiring for a touch panel (hereinafter, also referred to as the "electrode and the like") is disposed on the substrate, and a protective film for a touch panel which protects at least a portion of at least one of the electrode for a touch panel or the wiring for a touch panel are provided, and the protective film for a touch panel is the cured film of the embodiment.

The touch panel of the embodiment includes the cured film of the embodiment having a decreased WVTR (for example, the protective film for a touch panel), and accordingly, corrosion of the electrode and the like due to water vapor is prevented.

The touch panel of the preferred aspect may further include a first layer of high refractive index between the electrode and the like and the protective film for a touch panel.

The preferred aspect of the first layer of high refractive index is the same as the preferred aspect of the layer of high refractive index which can be included in the transfer film. The first layer of high refractive index may be formed by applying and drying a composition for forming the first layer of high refractive index, or may be formed by transferring the layer of high refractive index of the transfer film including the layer of high refractive index.

The touch panel of the aspect including the first layer of high refractive index is preferably formed by transferring the photosensitive layer and the layer of high refractive index of the transfer film, by using the transfer film of the embodiment of the aspect including the layer of high refractive index. In this case, the protective film for a touch panel is formed from the photosensitive layer of the transfer film and the first layer of high refractive index is formed from the layer of high refractive index of the transfer film.

The touch panel of the preferred aspect may further include a second layer of high refractive index between the substrate and the electrode and the like.

The preferred aspect of the second layer of high refractive index is the same as the preferred aspect of the layer of high refractive index which can be included in the transfer film.

The aspect in which the touch panel of the embodiment includes the first layer of high refractive index (more preferably, aspect of including the first layer of high refractive index and the second layer of high refractive index) has an advantage in which the electrode and the like is hardly recognized.

Regarding the structure of the touch panel, a structure of a capacitive input device disclosed in JP2014-10814A or JP2014-108541A may be referred to.

[Manufacturing Method of Touch Panel]

The preferred manufacturing method of the touch panel of the embodiment includes a step of preparing a substrate for a touch panel having a structure in which at least one of an electrode for a touch panel or a wiring for a touch panel is disposed on a substrate, a step of forming a photosensitive layer on a surface of the substrate for a touch panel on a side where at least one of the electrode for a touch panel or the wiring for a touch panel is disposed, using the photosensitive composition of the embodiment or the transfer film of the embodiment, a step of performing pattern exposure with respect to the photosensitive layer formed on the substrate for a touch panel, and a step of developing the pattern-exposed photosensitive layer to obtain a protective film for a touch panel which is a cured product of solid contents of the photosensitive composition and protects at least a portion of at least one of the electrode for a touch panel or the wiring for a touch panel.

The manufacturing method of the touch panel of the embodiment may include other steps, if necessary.

The step of preparing the substrate for a touch panel is a step for convenience.

The step of preparing the substrate for a touch panel may be a step of simply preparing the substrate for a touch panel manufactured in advance, or may be a step of manufacturing the substrate for a touch panel.

As the substrate of the substrate for a touch panel, the glass substrate or the resin substrate can be used.

At least one of the electrode for a touch panel or the wiring for a touch panel of the substrate for a touch panel may be formed on the other layer (for example, the second layer of high refractive index described above) disposed on the substrate.

At least one of the electrode for a touch panel or the wiring for a touch panel of the substrate for a touch panel can be, for example, formed by a method of normal photoetching (that is, photolithography and etching).

The preferred aspects of the step of forming the photosensitive layer, the step of performing pattern exposure, and the step of forming the protective film for a touch panel are respectively the same as the preferred aspects of the photosensitive layer forming step, the exposure step, and the development step of the manufacturing method A described above.

The manufacturing method of the touch panel of the embodiment may include a step (for example, washing step or the like) other than the steps described above. As the other step, a step (for example, washing step or the like) which may be provided in a normal photolithography step can be applied without any particular limitations.

First Specific Example of Touch Panel

Figure 2:
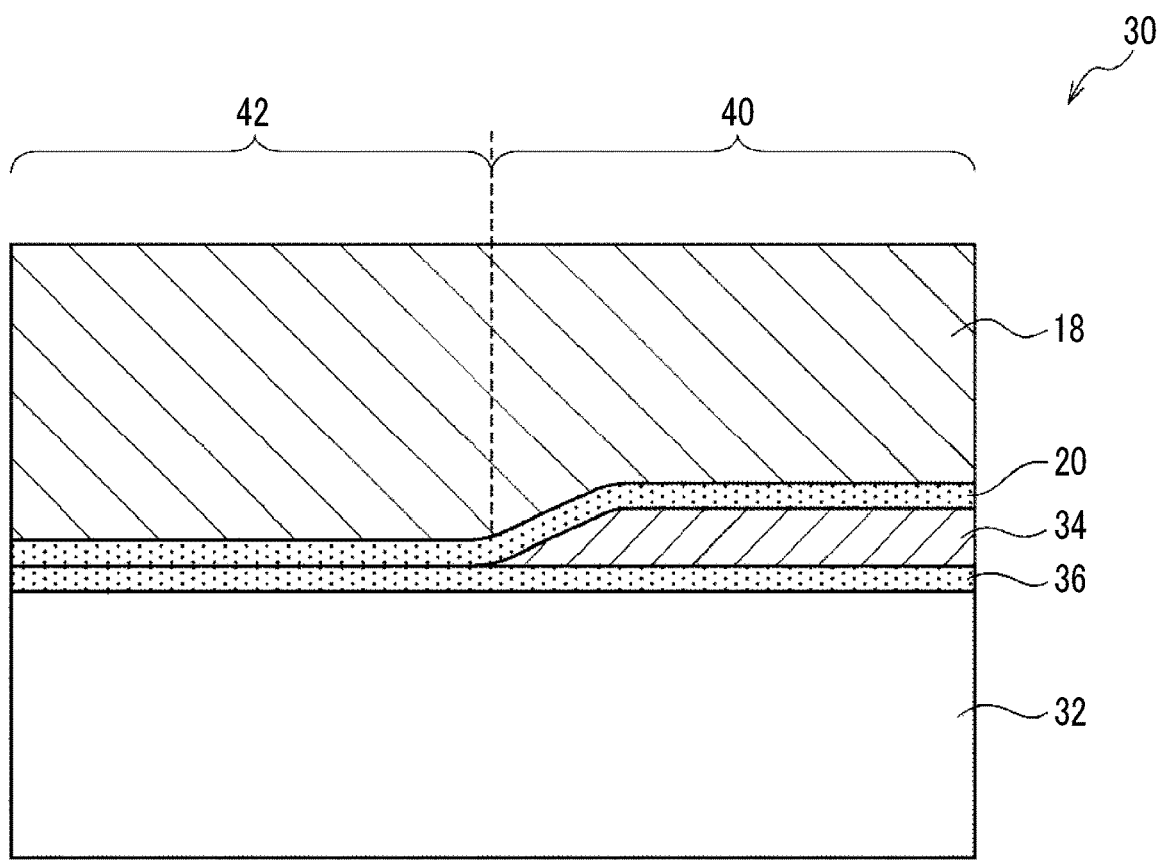
FIG. 2 is a schematic cross sectional view showing a first specific example of a touch panel according to one embodiment of the invention.

FIG. 2 is a schematic cross sectional view showing a touch panel 30 which is a first specific example of the touch panel of the embodiment.

As shown in FIG. 2, the touch panel 30 has a structure in which a substrate 32, a second layer of high refractive index 36, an electrode pattern 34 as the electrode for a touch panel, a first layer of high refractive index 20, and a protective film 18 as the protective film for a touch panel are disposed in this order.

The protective film 18 is a layer which is formed by transferring and curing of the photosensitive layer 18A of the transfer film 10 shown in FIG. 1, and the first layer of high refractive index 20 is a layer which is formed by transferring and curing the layer of high refractive index 20A of the transfer film 10 shown in FIG. 1.

In the touch panel 30, the protective film 18 and the first layer of high refractive index 20 covers the entire electrode pattern 34. However, the touch panel of the embodiment is not limited to this aspect. The protective film 18 and the first layer of high refractive index 20 may cover at least a portion of the electrode pattern 34.

In addition, the second layer of high refractive index 36 and the first layer of high refractive index 20 are preferably respectively continuously coated over a first region 40 in which the electrode pattern 34 is present and a second region 42 in which the electrode pattern 34 is not present directly or through another layer. Accordingly, the electrode pattern 34 is more hardly recognized.

The second layer of high refractive index 36 and the first layer of high refractive index 20 are preferably coated directly over both of the first region 40 and the second region 42, rather than the coating through the other layer. Examples of the "other layer" include an insulating layer and an electrode pattern other than the electrode pattern 34.

The first layer of high refractive index 20 is laminated over both of the first region 40 and the second region 42. The first layer of high refractive index 20 is adjacent to the second layer of high refractive index 36 and is also adjacent to the electrode pattern 34.

In a case where the shape of the end portion of the electrode pattern 34 at a portion in contact with the second layer of high refractive index 36 is a tapered shape as shown in FIG. 2, the first layer of high refractive index 20 is preferably laminated along the tapered shape (that is, at the same tilt as the taper angle).

As the electrode pattern 34, the transparent electrode pattern (for example, ITO pattern) is suitable.

The electrode pattern 34 can be, for example, formed by the following method.

A thin film for an electrode (for example, ITO film) is formed on the substrate 32 on which the second layer of high refractive index 36 is formed by sputtering. By applying a photosensitive resist for etching or transferring a photosensitive film for etching onto the thin film for an electrode, an etching protective layer is formed. Then, a desired pattern is formed on this etching protective layer by exposure and development. Next, a portion of the thin film for an electrode which is not covered with the etching protective layer is removed by etching. Accordingly, the thin film for an electrode is set to have a pattern having a desired shape (that is, electrode pattern 34). Then, the etching protective layer is removed by a peeling solution.

The first layer of high refractive index 20 and the protective film 18 can be, for example, formed with reference to the manufacturing method A.

The first layer of high refractive index 20 and the protective film 18 is, for example, formed on the substrate 32 on which the electrode pattern 34, as described below.

First, the transfer film 10 (that is, transfer film 10 having a laminated structure of protective film 16/layer of high refractive index 20A/photosensitive layer 18A/temporary support 12) shown in FIG. 1 is prepared.

Next, the protective film 16 is removed from the transfer film 10.

Then, the transfer film 10, from which the protective film 16 is removed, is laminated on the substrate 32 on which the second layer of high refractive index 36 and the electrode pattern 34 are provided in this order. The laminating is performed in a direction in which the layer of high refractive index 20A of the transfer film 10, from which the protective film 16 is removed, and the electrode pattern 34 are in contact with each other. By this laminating, a laminate having a laminated structure of temporary support 12/photosensitive layer 18A/layer of high refractive index 20A/electrode pattern 34/second layer of high refractive index 36/substrate 32 is obtained.

Next, the temporary support 12 is removed from the laminate.

Then, by performing the pattern exposure with respect to the laminate, from which the temporary support 12 is removed, the photosensitive layer 18A and the layer of high refractive index 20A are cured in a pattern shape. The curing of the photosensitive layer 18A and the layer of high refractive index 20A in a pattern shape may be respectively individually performed by individual pattern exposure, but the curing is preferably performed at the same time by the pattern exposure at one time.

By removing the unexposed portion (uncured portion) of the photosensitive layer 18A and the layer of high refractive index 20A by the development, the protective film 18 which is a patterned cured product of the photosensitive layer 18A (not shown regarding the pattern shape), and the first layer of high refractive index 20 which is a patterned cured product of the layer of high refractive index 20A (not shown regarding the pattern shape) are respectively obtained. The development of the photosensitive layer 18A and the layer of high refractive index 20A after the pattern exposure may be respectively individually performed by individual development, but the development is preferably performed at the same time by the development at one time.

Regarding the preferred aspects of the laminating, the pattern exposure, and the development, the preferred aspects of the manufacturing method A can be referred to, respectively.

Regarding the structure of the touch panel, a structure of a capacitive input device disclosed in JP2014-10814A or JP2014-108541A may be referred to.

Second Specific Example

Figure 3:
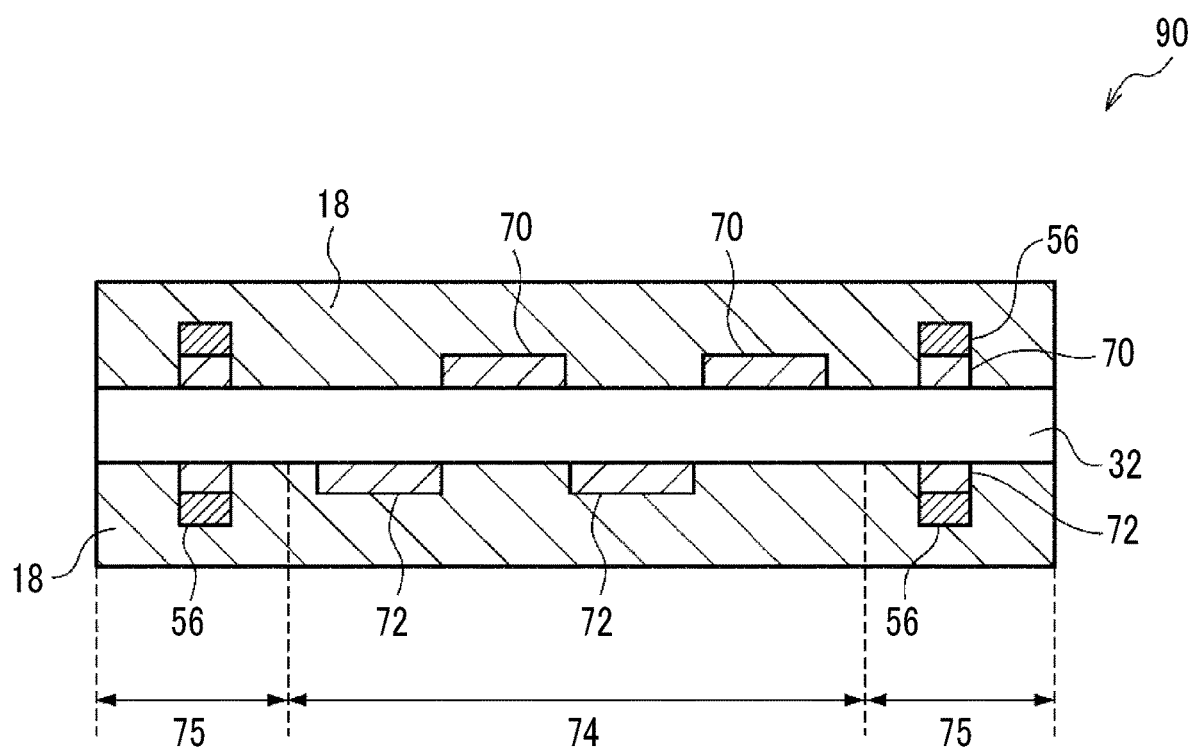
FIG. 3 is a schematic cross sectional view showing a second specific example of a touch panel according to the embodiment of the invention.

FIG. 3 is a schematic cross sectional view of a touch panel 90 which is a third specific example which is the touch panel of the embodiment.

As shown in FIG. 3, the touch panel 90 includes the electrode for a touch panel on both surfaces of the substrate 32. Specifically, the touch panel 90 includes a first transparent electrode pattern 70 on one surface of the substrate 32 and includes a second transparent electrode pattern 72 on the other surface thereof.

In the touch panel 90, a conductive member 56 which is a lead-out wiring is connected to the first transparent electrode pattern 70 and the second transparent electrode pattern 72, respectively.

In the touch panel 90, the protective film 18 is formed on one surface of the substrate 32 so as to cover the first transparent electrode pattern 70 and the conductive member 56, and the protective film 18 is formed on the other surface 56 of the substrate so as to cover the second transparent electrode pattern 72 and the conductive member 56.

The first layer of high refractive index and the second layer of high refractive index in the first specific example may be respectively provided on one surface and the other surface of the substrate 32.

The touch panel 90 includes a display region 74 corresponding to a region to be touched by a finger or a touch pen, and a non-display region 75 corresponding to a frame portion.

[Image Display Apparatus]

The touch panel of the embodiment (for example, the touch panels of the first and second specific examples) is included in an image display apparatus.

As the structure of the image display apparatus, for example, a structure disclosed in "The latest Touch Panel Technology" (published 6 Jul. 2009, Techno Times), "Technologies and Developments of Touch Panels" supervised by Yuji Mitani, CMC Publishing CO., LTD. (2004, 12), FPD International 2009 Forum T-11 lecture text book, Cypress Semiconductor Corporation application note AN 2292 can be applied.

EXAMPLES

Hereinafter, examples of the invention will be described, but the invention is not limited to the following examples.

Hereinafter, "part" and "%" respectively mean "parts by mass" and "% by mass".

As shown below, the polymers P1 to P12 which are specific examples of the polymer (P) of the embodiment and the polymers R1 to R7 which are comparative polymers were respectively synthesized.

<Synthesis of Polymer P1>

Methacrylic acid (MAA) (20.1 g; 35% by mol), styrene (St) (24.4 g; 35% by mol), and hydroxyethyl methacrylate (HEMA) (26.1 g; 30% by mol) as the monomers were dissolved in propylene glycol monomethyl ether acetate (PGMEA) (18 g), and accordingly, a dropping solution A is prepared.

In addition, V-601 (dimethyl 2,2'-azobis (2-methylpropionate), manufactured by Wako Pure Chemical Industries, Ltd.) (2.4 g; 1.65% by mol with respect to a total amount of monomers) as an initiator was dissolved in PGMEA (37.1 g), and accordingly, a dropping solution B was obtained.

PGMEA (15 g) and propylene glycol monomethyl ether (MFG) (60 g) were put into a 500 mL flask, and the temperature of the liquid in the flask was increased to 90° C. by a heating bath. The dropping solution A and the dropping solution B were added dropwise thereto for 3 hours at the same time, and the mixture was stirred for 1 hour as the post reaction. A solution obtained by dissolving V-601 (0.6 g) as the initiator to PGMEA (3 g) was added thereto and stirred for 1 hour. Then, the flask is extracted from the heating bath, and the reaction solution in the flask was cooled while diluting the PGMEA (44.7 g).

Next, the reaction solution in the flask was heated to 100° C., and a solution obtained by dissolving tetraethylammonium bromide (TEAB) (0.45 g) as an additive catalyst and hydroquinone monomethyl ether (MEHQ) (0.2 g) as a polymerization inhibitor in PGMEA (6 g) was added thereto.

Glycidyl methacrylate (GMA) (14.3 g; 15% by mol) was added dropwise to the obtained liquid for 1 hour, the post reaction was performed for 6 hours, and cooled. Accordingly, a solution of the polymer P1 (polymer concentration of 35% by mass, diluent PGMEA) was obtained.

Table 1 shows the kind and the amount of each structural unit included in the polymer P1, the kind and the amount of the initiator, the kind and the amount of the additive catalyst, and the weight-average molecular weight (Mw) of the polymer P1, respectively.

In Table 1, the structural unit other than the structural unit including the radical polymerizable group is shown with abbreviation of the monomer for forming each structural unit.

The structural unit including the radical polymerizable group is shown in a format of an additive structure of the monomer and the monomer. For example, MAA-GMA means the structural unit in which glycidyl methacrylate is added to the structural unit derived from methacrylic acid.

<Synthesis of Polymers P2 to P12 and R1 to R6>

The polymers P2 to P12 and R1 to R6 were synthesized in the same manner as in the synthesis of the polymer P1, except that each structural unit included in the polymers and the content of each structural unit were changed as shown in Table 1, by changing the kind and the amount of the monomer. However, regarding the synthesis of the polymers P5 and P6, a combination of the kind of the initiator, the amount of the initiator, the kind of the additive catalyst, and the amount of the additive catalyst was further changed as shown in Table 1. All of the polymers were synthesized as a polymer solution, and the amount of diluent (PGMEA) was adjusted so that a concentration of the polymer in the polymer solution is 35% by mass.

Here, the polymers R1 to R6 are comparative polymers.

TABLE 1

| | | Polymer | | | | | | | | |
|---|---|---|---|---|---|---|---|---|---|---|
| | | P1 | P2 | P3 | P4 | P5 | P6 | P7 | P8 | P9 |
| Structural unit derived from vinylbenzene derivative (mol %) | St | 35 | 45 | 55 | | 55 | 55 | 55 | 55 | 45 |
| | VN | | | | 45 | | | | | |
| Structural unit including radical polymerizable group (mol %) | MAA-GMA | 15 | 15 | 15 | 15 | | | 15 | 15 | 15 |
| | MAA-M100 | | | | | 15 | | | | |
| | AA-GMA | | | | | | 15 | | | |
| Structural unit including acid group (mol %) | MAA | 20 | 20 | 20 | 20 | 20 | | 20 | 20 | 20 |
| | AA | | | | | | 20 | | | |
| Structural unit including functional group selected from hydroxyl group and amino group (mol %) | HEMA | 30 | 20 | 10 | 20 | 10 | 10 | | | 15 |
| | 4HBA | | | | | | | 10 | | |
| | BAMA | | | | | | | | 10 | |
| | 2HPMA | | | | | | | | | |
| | 2HBMA | | | | | | | | | |
| Other structural units (mol %) | MMA | | | | | | | | | 5 |
| | nBMA | | | | | | | | | |
| | DCPMA | | | | | | | | | |
| Initiator (mol %) | V-601 | 2 | 2 | 2 | 2 | | | 2 | 2 | 2 |
| | V-65 | | | | | 2 | 2 | | | |
| Additive catalyst (% by mass) | TEAB | 0.4 | 0.4 | 0.4 | 0.4 | | 0.4 | 0.4 | 0.4 | 0.4 |
| | TBAB | | | | | 0.4 | | | | |
| weight-average molecular weight (Mw) | | 35000 | 35000 | 35000 | 35000 | 30000 | 30000 | 35000 | 35000 | 35000 |

| | | Polymer | | | | | | | | |
|---|---|---|---|---|---|---|---|---|---|---|
| | | P10 | P11 | P12 | R1 | R2 | R3 | R4 | R5 | R6 |
| Structural unit derived from vinylbenzene derivative (mol %) | St | 45 | 45 | 45 | 25 | | 35 | 45 | 35 | 35 |
| | VN | | | | | | | | | |
| Structural unit including radical polymerizable group (mol %) | MAA-GMA | 15 | 5 | 15 | 15 | 15 | | 15 | 15 | 15 |
| | MAA-M100 | | | | | | | | | |
| | AA-GMA | | | | | | | | | |
| Structural unit including acid group (mol %) | MAA | 20 | 20 | 20 | 20 | 20 | 20 | 20 | 20 | 20 |
| | AA | | | | | | | | | |
| Structural unit including functional group selected from hydroxyl group and amino group (mol %) | HEMA | 15 | 15 | 5 | 30 | 30 | 30 | | | |
| | 4HBA | | | | | | | | | |
| | BAMA | | | | | | | | | |
| | 2HPMA | | | | | | | | 30 | |
| | 2HBMA | | | | | | | | | 30 |
| Other structural units (mol %) | MMA | | | | 15 | 10 | 30 | 15 | 20 | |
| | nBMA | | 15 | | | | | | | |
| | DCPMA | 5 | | | | | | | | |
| Initiator (mol %) | V-601 | 2 | 2 | 2 | 2 | 2 | 2 | 2 | 2 | 2 |
| | V-65 | | | | | | | | | |

TABLE 1-continued

| Additive catalyst (% by mass) | TEAB TBAB | 0.4 | 0.4 | 0.4 | 0.4 | 0.4 | 0.4 | 0.4 | 0.4 | 0.4 |
|---|---|---|---|---|---|---|---|---|---|---|
| weight-average molecular weight (Mw) | | 35000 | 35000 | 35000 | 35000 | 35000 | 35000 | 35000 | 35000 | 35000 |

Description in Table 1-
The abbreviations mean as follows.
St: structural unit derived from styrene (Wako Pure Chemical Industries, Ltd.)
VN: structural unit derived from vinyl naphthalene (Wako Pure Chemical Industries, Ltd.)
MAA-GMA: structural unit in which glycidyl methacrylate is added to a structural unit derived from methacrylic acid
MAA-M100: structural unit in which CYM-M100 (Daicel; 3,4-epoxycyclohexylmethyl methacrylate) is added to the structural unit derived from methacrylic acid
AA-GMA: structural unit in which glycidyl methacrylate is added to a structural unit derived from acrylic acid
MAA: structural unit derived from methacrylic acid (Wako Pure Chemical Industries, Ltd.)
AA: structural unit derived from acrylic acid (Wako Pure Chemical Industries, Ltd.)
HEMA: structural unit derived from hydroxyethyl methacrylate (Wako Pure Chemical Industries, Ltd.) (structural unit including primary hydroxyl group)
4HBA: structural unit derived from 4-hydroxybutyl acrylate (Wako Pure Chemical Industries, Ltd.) (structural unit including primary hydroxyl group)
BAMA: structural unit derived from 2-(t-butylamino) ethyl methacrylate (Sigma-Aldrich Corporation) (structural unit including amino group)
2HPMA: structural unit derived from 2-hydroxypropyl methacrylate (Wako Pure Chemical Industries, Ltd.) (structural unit including secondary hydroxyl group)
2HBMA: structural unit derived from 2-hydroxybutyl methacrylate (Wako Pure Chemical Industries, Ltd.) (structural unit including secondary hydroxyl group)
MMA: methyl methacrylate (Wako Pure Chemical Industries, Ltd.)
nBMA: normal butyl methacrylate (Wako Pure Chemical Industries, Ltd.)
DCPMA: dicyclopentanyl methacrylate (FANCRYL 513M, Hitachi Chemical Co., Ltd.)
V-601: dimethyl 2,2'-azobis (2-methylpropionate) (Wako Pure Chemical Industries, Ltd.)
V-65: 2,2'-azobis (2,4-dimethylvaleronitrile) (Wako Pure Chemical Industries, Ltd.)
TEAB: tetraethylammonium bromide (Wako Pure Chemical Industries, Ltd.)
TBAB: tetrabutylammonium bromide (Wako Pure Chemical Industries, Ltd.)

<Synthesis of Polymer R7>

The following polymer R7 (Mw of 7,800) which is a comparative polymer was synthesized by the same method as the method disclosed in a paragraph 0277 of JP2007-256669A. However, the polymer R7 was synthesized as a polymer solution, and the amount of diluent (PGMEA) was adjusted so that a concentration of the polymer in the polymer solution is 35% by mass.

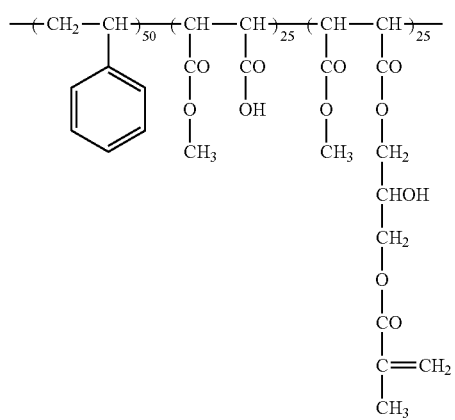

Polymer R7

Examples 1 to 24 and Comparative Examples 1 to 7

<Producing of Photosensitive Composition>

A photosensitive composition having the composition shown in Table 2 was produced.

In Table 2, the amount of the polymer means the amount of the polymer solution (concentration of polymer of 35% by mass).

<Evaluation of Water Vapor Transmission Rate (WVTR)>
—Producing of Sample for Measuring Water Vapor Permeability—

Any one of the photosensitive composition of each of examples and comparative examples was applied and dried on a polyethylene terephthalate (PET) film having a thickness of 75 jam as the temporary support using a slit-shaped nozzle, to form a photosensitive layer having a thickness of 10 jam, and a transfer film for producing a sample was obtained.

Next, the transfer film for producing a sample was laminated on PTFE (ethylene tetrafluoride resin) membrane filter FP-100-100 manufactured by Sumitomo Electric Industries, Ltd., and a laminate A having a layer structure of temporary support/photosensitive layer having a thickness of 10 μm/membrane filter was formed. In the conditions of the laminating, a temperature of the membrane filter was set as 40° C., a temperature of a laminating roll was set as 110° C., line pressure was set as 3 N/cm, and a transportation speed was set as 2 m/min.

Next, the temporary support was peeled off from the laminate A.

By repeating the above operation four times, a laminate B having a laminated structure of photosensitive layer having a thickness of 40 μm in total/membrane filter was formed.

The photosensitive layer of the obtained laminate B was exposed at exposure intensity of 300 mJ/cm² by i ray, and then, the post baking was performed at 145° C. for 30 minutes to cure the photosensitive layer, and the cured film was formed.

As described above, a sample for measuring water vapor permeability having the laminated structure of cured film having a thickness of 40 μm in total/membrane filter was obtained.

—Measurement of Water Vapor Transmission Rate (WVTR)—

The measurement of the water vapor permeability was performed by a cup method using the sample for measuring water vapor permeability, with reference to JIS-Z-0208 (1976). Hereinafter, the details will be described.

First, a circular sample having a diameter of 70 mm was cut from the sample for measuring water vapor permeability. Next, 20 g of dried calcium chloride was put in a measurement cup, and covered with the circular sample, and accordingly, a lid-attached measurement cup was prepared.

This lid-attached measurement cup was left in a constant-temperature and constant-humidity tank for 24 hours under the condition of 65° C. of 90% RH. The water vapor transmission rate (WVTR) of the circular sample (unit: $g/m^2 \cdot day$) was calculated from a change in mass of the lid-attached measurement cup before and after the leaving.

The measurement described above was performed three times and an average value of the WVTR in three times of the measurement was calculated. The water vapor transmission rate (WVTR) was evaluated based on the average value of the WVTR according to the evaluation standards. In the evaluation standard below, A and B are suitable for practical use.

The results are shown in Table 2.

In the measurement, the WVTR of the circular sample having a laminated structure of cured film/membrane filter was measured as described above. However, the WVTR of the membrane filter is extremely higher than the WVTR of the cured film, and accordingly, in the measurement, the WVTR of the cured film is substantially measured.

—Evaluation Standard of Water Vapor Transmission Rate (WVTR)—

A: Average value of the WVTR was smaller than 100 $g/m^2 \cdot day$ and the WVTR of the cured film was extremely decreased.

B: Average value of the WVTR was equal to or greater than 100 $g/m^2 \cdot day$ and smaller than 150 $g/m^2 \cdot day$ and the WVTR of the cured film was decreased.

C: Average value of the WVTR was equal to or greater than 150 $g/m^2 \cdot day$ and smaller than 200 $g/m^2 \cdot day$ and the WVTR of the cured film was high.

D: Average value of the WVTR was equal to or greater than 200 $g/m^2 \cdot day$ and the WVTR of the cured film was extremely high.

TABLE 2

| | Composition of photosensitive composition (parts by mass) | | | | | | | | | |
|---|---|---|---|---|---|---|---|---|---|---|
| | Polymer (P) or comparative polymer | | Radical polymerizable monomer | | | | Radical polymerization initiator | | | |
| | Kind | Amount | Kind | Amount | Kind | Amount | Kind | Amount | Kind | Amount |
| Example 1 | P1 | 15.63 | A-DCP | 5.63 | TO-2349 | 0.93 | OXE-02 | 0.11 | Irg-907 | 0.21 |
| Example 2 | P2 | 15.63 | A-DCP | 5.63 | TO-2349 | 0.93 | OXE-02 | 0.11 | Irg-907 | 0.21 |
| Example 3 | P3 | 15.63 | A-DCP | 5.63 | TO-2349 | 0.93 | OXE-02 | 0.11 | Irg-907 | 0.21 |
| Example 4 | P4 | 15.63 | A-DCP | 5.63 | TO-2349 | 0.93 | OXE-02 | 0.11 | Irg-907 | 0.21 |
| Example 5 | P5 | 15.63 | ADCP | 5.63 | TO-2349 | 0.93 | OXE-02 | 0.11 | Irg-907 | 0.21 |
| Example 6 | P6 | 15.63 | A-DCP | 5.63 | TO-2349 | 0.93 | OXE-02 | 0.11 | Irg-907 | 0.21 |
| Example 7 | P7 | 15.63 | A-DCP | 5.63 | TO-2349 | 0.93 | OXE-02 | 0.11 | Irg-907 | 0.21 |
| Example 8 | P8 | 15.63 | A-DCP | 5.63 | TO-2349 | 0.93 | OXE-02 | 0.11 | Irg-907 | 0.21 |
| Example 9 | P9 | 15.63 | A-DCP | 5.63 | TO-2349 | 0.93 | OXE-02 | 0.11 | Irg-907 | 0.21 |
| Example 10 | P10 | 15.63 | A-DCP | 5.63 | TO-2349 | 0.93 | OXE-02 | 0.11 | Irg-907 | 0.21 |
| Example 11 | P11 | 15.63 | A-DCP | 5.63 | TO-2349 | 0.93 | OXE-02 | 0.11 | Irg-907 | 0.21 |
| Example 12 | P12 | 15.63 | A-DCP | 5.63 | TO-2349 | 0.93 | OXE-02 | 0.11 | Irg-907 | 0.21 |
| Example 13 | P1 | 15.63 | AD-TMP | 5.63 | TO-2349 | 0.93 | OXE-02 | 0.11 | Irg-907 | 0.21 |
| Example 14 | P1 | 15.63 | A-DCP | 5.63 | TO-2349 | 0.93 | OXE-02 | 0.11 | Irg-907 | 0.21 |
| Example 15 | P1 | 15.63 | A-DCP | 5.63 | TO-2349 | 0.93 | OXE-02 | 0.11 | Irg-907 | 0.21 |
| Example 16 | P1 | 15.63 | A-DCP | 5.63 | TO-2349 | 0.93 | OXE-02 | 0.11 | Irg-907 | 0.21 |
| Example 17 | P2 | 15.63 | A-DCP | 5.63 | DPHA | 0.93 | OXE-01 | 0.11 | Irg-907 | 0.21 |
| Example 18 | P2 | 15.63 | A-DCP | 5.63 | TO-2349 | 0.93 | OXE-03 | 0.31 | — | — |
| Example 19 | P2 | 15.63 | A-DCP | 5.63 | TO-2349 | 0.93 | OXE-02 | 0.11 | Irg-379EG | 0.21 |
| Example 20 | P3 | 15.63 | A-DCP | 5.63 | DPHA | 0.93 | OXE-01 | 0.11 | Irg-907 | 0.21 |
| Example 21 | P3 | 15.63 | A-DCP | 5.63 | TO-2349 | 0.93 | OXE-03 | 0.31 | — | — |
| Example 22 | P3 | 15.63 | A-DCP | 5.63 | TO-2349 | 0.93 | OXE-02 | 0.11 | Irg-907 | 0.21 |
| Example 23 | P3 | 15.63 | — | — | DPHA | 6.56 | OXE-02 | 0.11 | Irg-907 | 0.21 |
| Example 24 | P3 | 17.63 | A-DCP | 3.63 | TO-2349 | 0.93 | OXE-02 | 0.11 | Irg-907 | 0.21 |
| Comparative example 1 | R1 | 15.63 | A-DCP | 5.63 | TO-2349 | 0.93 | OXE-02 | 0.11 | Irg-907 | 0.21 |
| Comparative example 2 | R2 | 15.63 | A-DCP | 5.63 | TO-2349 | 0.93 | OXE-02 | 0.11 | Irg-907 | 0.21 |
| Comparative example 3 | R3 | 15.63 | A-DCP | 5.63 | TO-2349 | 0.93 | OXE-02 | 0.11 | Irg-907 | 0.21 |
| Comparative example 4 | R4 | 15.63 | A-DCP | 5.63 | TO-2349 | 0.93 | OXE-02 | 0.11 | Irg-907 | 0.21 |
| Comparative example 5 | R5 | 15.63 | A-DCP | 5.63 | TO-2349 | 0.93 | OXE-02 | 0.11 | Irg-907 | 0.21 |
| Comparative example 6 | R6 | 15.63 | A-DCP | 5.63 | TO-2349 | 0.93 | OXE-02 | 0.11 | Irg-907 | 0.21 |
| Comparative example 7 | R7 | 15.63 | A-DCP | 5.63 | TO-2349 | 0.93 | OXE-02 | 0.11 | Irg-907 | 0.21 |

TABLE 2-continued

| | Composition of photosensitive composition (parts by mass) | | | | | | | | Evaluation result of WVTR of cured film |
|---|---|---|---|---|---|---|---|---|---|
| | Thermal crosslinking compound | | Surfactant | | Solvent | | | | |
| | Kind | Amount | Kind | Amount | Kind | Amount | Kind | Amount | |
| Example 1 | TPA-B80E | 3.63 | F551 | 0.02 | PGEMA | 31 | MEK | 40 | B |
| Example 2 | TPA-B80E | 3.63 | F551 | 0.02 | PGEMA | 31 | MEK | 40 | A |
| Example 3 | TPA-B80E | 3.63 | F551 | 0.02 | PGEMA | 31 | MEK | 40 | A |
| Example 4 | TPA-B80E | 3.63 | F551 | 0.02 | PGEMA | 31 | MEK | 40 | A |
| Example 5 | TPA-B80E | 3.63 | F551 | 0.02 | PGEMA | 31 | MEK | 40 | A |
| Example 6 | TPA-B80E | 3.63 | F551 | 0.02 | PGEMA | 31 | MEK | 40 | A |
| Example 7 | TPA-B80E | 3.63 | F551 | 0.02 | PGEMA | 31 | MEK | 40 | A |
| Example 8 | TPA-B80E | 3.63 | F551 | 0.02 | PGEMA | 31 | MEK | 40 | A |
| Example 9 | TPA-B80E | 3.63 | F551 | 0.02 | PGEMA | 31 | MEK | 40 | A |
| Example 10 | TPA-B80E | 3.63 | F551 | 0.02 | PGEMA | 31 | MEK | 40 | A |
| Example 11 | TPA-B80E | 3.63 | F551 | 0.02 | PGEMA | 31 | MEK | 40 | B |
| Example 12 | TPA-B80E | 3.63 | F551 | 0.02 | PGEMA | 31 | MEK | 40 | B |
| Example 13 | TPA-B80E | 3.63 | F551 | 0.02 | PGEMA | 31 | MEK | 40 | B |
| Example 14 | X3071.04 | 3.63 | F551 | 0.02 | PGEMA | 31 | MEK | 40 | A |
| Example 15 | B-830 | 3.63 | F551 | 0.02 | PGEMA | 31 | MEK | 40 | A |
| Example 16 | TAS-200 | 3.63 | F551 | 0.02 | PGEMA | 31 | MEK | 40 | B |
| Example 17 | TPA-B80E | 3.63 | F554 | 0.01 | PGEMA | 71 | — | — | A |
| Example 18 | TPA-B80E | 3.63 | F552 | 0.01 | PGEMA | 31 | MEK | 40 | A |
| Example 19 | TPA-B80E | 363 | F511 | 0.02 | PGEMA | 31 | MEK | 40 | A |
| Example 20 | TPA-B80E | 3.63 | F554 | 0.01 | PGEMA | 71 | — | — | A |
| Example 21 | TPA-B80E | 3.63 | F552 | 0.01 | PGEMA | 31 | MEK | 40 | A |
| Example 22 | X3071.04 | 3.63 | F511 | 0.02 | PGEMA | 31 | MEK | 40 | A |
| Example 23 | TPA-B80E | 3.63 | F511 | 0.02 | PGEMA | 31 | MEK | 40 | A |
| Example 24 | TPA-B80E | 3.63 | F511 | 0.02 | PGEMA | 31 | MEK | 40 | A |
| Comparative example 1 | TPA-B80E | 3.63 | F551 | 0.02 | PGEMA | 31 | MEK | 40 | D |
| Comparative example 2 | TPA-B80E | 3.63 | F551 | 0.02 | PGEMA | 31 | MEK | 40 | D |
| Comparative example 3 | TPA-B80E | 3.63 | F551 | 0.02 | PGEMA | 31 | MEK | 40 | D |
| Comparative example 4 | TPA-B80E | 3.63 | F551 | 0.02 | PGEMA | 31 | MEK | 40 | C |
| Comparative example 5 | TPA-B80E | 3.63 | F551 | 0.02 | PGEMA | 31 | MEK | 40 | C |
| Comparative example 6 | TPA-B80E | 3.63 | F551 | 0.02 | PGEMA | 31 | MEK | 40 | C |
| Comparative example 7 | TPA-B80E | 3.63 | F551 | 0.02 | PGEMA | 31 | MEK | 40 | C |

Description in Table 2-The amount of each component means parts by mass. The amount of the polymer in Table 2 means the amount of the polymer solution (concentration of the polymer of 35% by mass).
"—" means that the corresponding component is not included.
The thermal crosslinking compound is a compound including two or more thermal reactive groups in one molecule.
The abbreviation of each component means as follows. A-DCP: Tricyclodecane dimethanol diacrylate (Shin-Nakamura Chemical Co., Ltd.; difunctional monomer)
TO-2349: carboxylic acid-containing monomer (Toagosei Co., Ltd.; mixture of pentafunctional monomer and hexafunctional monomer)
DPHA: Dipentaerythritol hexaacrylate (manufactured by Nippon Kayaku Co., Ltd., "KAYARAD DPHA")
AD-TMP: ditrimethylolpropane tetraacrylate (Shin-Nakamura Chemical Co., Ltd.; tetrafunctional monomer)
OXE-02: Ethanone, 1-[9-ethyl-6-(2-methylbenzoyl)-9H-carbazole-3-yl]—, 1-(O-acetyloxime) (BASF Japan Ltd., oxime-based photopolymerization initiator)
OXE-03: photopolymerization initiator manufactured by BASF Japan Ltd. Irg-907: 2-methyl-1-(4-methylthiophenyl)-2-morpholinopropan-1-one (BASF Japan Ltd.; α-aminoalkylphenone-based photopolymerization initiator)
Irg-379EG: 2-(dimethylamino)-2-[(4-methylphenyl) methyl]-1-[4-(4-morpholinyl) phenyl]-1-butanone (manufactured by BASF Japan Ltd.; photopolymerization initiator)
TPA-B80E: DURANATE TPA-B80E (Asahi Kasei Corporation; compound including two or more blocked isocyanate groups in one molecule)
X3071.04: DURANATE X3071.04 (Asahi Kasei Corporation; compound including two or more blocked isocyanate groups in one molecule)
B-830: TAKENATE B-830 (Mitsui Chemicals, Inc.; compound including two or more blocked isocyanate groups in one molecule)
TAS-200: Naphthoquinone diazide sulfonic acid ester of 4-{4-[1,1-bis (4-hydroxyphenyl) ethyl]-α, α-dimethylbenzyl} phenol (Toyo Gosei Co., Ltd.; compound including two or more blocked ketene groups in one molecule)
F551: MEGAFACE F-551 (DIC Corporation; fluorine-containing group • lipophilic group-containing oligomer)
F552: MEGAFACE F-552 (DIC Corporation; fluorine-containing group • lipophilic group-containing oligomer)
F554: MEGAFACE F-554 (DIC Corporation; fluorine-containing group • lipophilic group-containing oligomer)
PGMEA: propylene glycol monomethyl ether acetate
MEK: methyl ethyl ketone As shown in Table 1 and Table 2, in Examples 1 to 24 using the photosensitive composition including the polymer (P) which includes a structural unit derived from a vinylbenzene derivative, a structural unit including a radical polymerizable group, and a structural unit including at least one kind of functional group selected from the group consisting of a primary hydroxyl group and/or an amino group, and in which the content of the structural unit derived from the vinylbenzene derivative is equal to or greater than 30% by mol, and a radical polymerization initiator, the WVTR of the cured film was decreased.

With respect to these examples, in Comparative Examples 1 and 2 in which the content of the structural unit derived from a vinylbenzene derivative in the polymer is smaller than 30% by mol, Comparative Example 3 in which the polymer does not include the structural unit including the radical polymerizable group, and Comparative Examples 4 to 7 in which the polymer does not include the structural unit including at least one kind of functional group selected from a primary hydroxyl group and an amino group, the WVTR of the cured film was high.

The contents of JP2016-134491A filed on Jul. 6, 2016 are incorporated herein by reference.

All of the documents, the patent applications, and the technology standards described here are incorporated here by reference.

What is claimed is:

1. A photosensitive composition comprising:
a polymer (P) which includes a structural unit derived from a vinylbenzene derivative, a structural unit including a radical polymerizable group, a structural unit including an acid group, and a structural unit including at least one kind of functional group selected from the group consisting of a primary hydroxyl group and an amino group, and in which an amount of the structural unit derived from the vinylbenzene derivative is equal to or greater than 30% by mol with respect to a total amount of all of the structural units included in the polymer (P); and
a radical polymerization initiator,
wherein the structural unit including an acid group is represented by Formula (4):

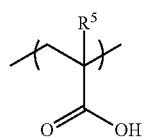

(4)

wherein $R^5$ represents a hydrogen atom or an alkyl group.

2. The photosensitive composition according to claim 1, wherein the amount of the structural unit derived from the vinylbenzene derivative in the polymer (P) is equal to or greater than 40% by mol with respect to the total amount of all of the structural units included in the polymer (P).

3. The photosensitive composition according to claim 1, wherein the amount of the structural unit including the radical polymerizable group in the polymer (P) is equal to or greater than 10% by mol with respect to the total amount of all of the structural units included in the polymer (P).

4. The photosensitive composition according to claim 1, wherein the amount of the structural unit including at least one kind of functional group selected from the group consisting of a primary hydroxyl group and an amino group in the polymer (P) is equal to or greater than 10% by mol with respect to the total amount of all of the structural units included in the polymer (P).

5. The photosensitive composition according to claim 1, wherein the amount of the structural unit derived from the vinylbenzene derivative in the polymer (P) is equal to or greater than 40% by mol, the amount of the structural unit including the radical polymerizable group in the polymer (P) is equal to or greater than 10% by mol, and the amount of the structural unit including at least one kind of functional group selected from the group consisting of a primary hydroxyl group and an amino group in the polymer (P) is equal to or greater than 10% by mol, with respect to the total amount of all of the structural units included in the polymer (P).

6. The photosensitive composition according to claim 1, further comprising:
a di- or higher functional radical polymerizable monomer.

7. The photosensitive composition according to claim 1, further comprising:
a compound including two or more thermal reactive groups in one molecule.

8. The photosensitive composition according to claim 7, wherein the thermal reactive group is at least one kind selected from the group consisting of an isocyanate group, a ketene group, a blocked isocyanate group, and a blocked ketene group.

9. The photosensitive composition according to claim 5, further comprising:
a di- or higher functional radical polymerizable monomer, and
a compound including two or more thermal reactive groups in one molecule, wherein the thermal reactive group is at least one kind selected from the group consisting of an isocyanate group, a ketene group, a blocked isocyanate group, and a blocked ketene group.

10. A protective film for a touch panel prepared by a process of forming a photosensitive layer on a surface of a substrate for a touch panel on a side at which at least one of an electrode for a touch panel or wiring for a touch panel is disposed, using the photosensitive composition according to claim 1, performing pattern-exposing of the photosensitive layer formed on the substrate for a touch panel; and developing the pattern-exposed photosensitive layer to obtain a protective film for a touch panel which protects at least a part of at least one of the electrode for a touch panel or the wiring for a touch panel.

11. A protective film for a touch panel prepared by a process of forming a photosensitive layer on a surface of a substrate for a touch panel on a side at which at least one of an electrode for a touch panel or wiring for a touch panel is disposed, using the photosensitive composition according to claim 9, performing pattern-exposing of the photosensitive layer formed on the substrate for a touch panel; and developing the pattern-exposed photosensitive layer to obtain a protective film for a touch panel which protects at least a part of at least one of the electrode for a touch panel or the wiring for a touch panel.

12. A transfer film comprising:
a temporary support; and
a photosensitive layer including solid contents of the photosensitive composition according to claim 1.

13. A transfer film comprising:
a temporary support; and
a photosensitive layer including solid contents of the photosensitive composition according to claim 9.

14. A protective film for a touch panel prepared by a process of forming a photosensitive layer on a surface of a substrate for a touch panel on a side at which at least one of an electrode for a touch panel or wiring for a touch panel is disposed, using the transfer film according to claim 12, performing pattern-exposing of the photosensitive layer formed on the substrate for a touch panel; and developing the pattern-exposed photosensitive layer to obtain a protective film for a touch panel which protects at least a part of at least one of the electrode for a touch panel or the wiring for a touch panel.

15. A cured film prepared by applying a layer of the photosensitive composition according to claim 1 to a surface, and photo- and/or heat-curing the applied composition to obtain a cured product of solid contents of the photosensitive composition according to claim 1.

16. A cured film prepared by applying a layer of the photosensitive composition according to claim 9 to a surface, and photo- and/or heat-curing the applied composition to obtain a cured product of solid contents of the photosensitive composition according to claim 9.

17. A touch panel comprising a substrate, a structure in which at least one of an electrode for a touch panel or a wiring for a touch panel is disposed on the substrate, and a protective film for a touch panel including the cured film according to claim 15 which protects at least a part of at least one of the electrode for a touch panel or the wiring for a touch panel.

18. A touch panel comprising a substrate, a structure in which at least one of an electrode for a touch panel or a wiring for a touch panel is disposed on the substrate, and a protective film for a touch panel including the cured film according to claim 16 which protects at least a part of at least one of the electrode for a touch panel or the wiring for a touch panel.

19. A manufacturing method of a touch panel comprising:
  preparing a substrate for a touch panel including a structure in which at least one of an electrode for a touch panel or a wiring for a touch panel is disposed on the substrate;
  forming a photosensitive layer on a surface of the substrate for a touch panel on a side at which at least one of the electrode for a touch panel or the wiring for a touch panel is disposed, by using the photosensitive composition according to claim 10;
  performing pattern-exposing of the photosensitive layer formed on the substrate for a touch panel; and
  developing the pattern-exposed photosensitive layer to obtain a protective film for a touch panel which protects at least a part of at least one of the electrode for a touch panel or the wiring for a touch panel.

20. The photosensitive composition according to claim 1, wherein
  the amount of the structural unit derived from the vinylbenzene derivative is 40% to 80% by mol;
  the amount of the structural unit including the radical polymerizable group is 10% to 50% by mol; and
  the amount of the structural unit including at least one kind of functional group selected from a primary hydroxyl group and an amino group is 10% to 50% by mol,
  all with respect to the total amount of all of the structural units included in the polymer (P).

21. The photosensitive composition according to claim 1, wherein the amount of the structural unit including an acid group is 5% to 50% by mol with respect to the total amount of all of the structural units included in the polymer (P).

22. The photosensitive composition according to claim 1, wherein the structural unit derived from a vinylbenzene derivative is at least one unit selected from a styrene derivative unit, a 1-vinylnaphthalene derivative unit, a 2-vinylnaphthalene derivative unit, a vinylbiphenyl derivative unit, and a vinylanthracene derivative unit.

23. The photosensitive composition according to claim 1, wherein the structural unit including a radical polymerizable group is represented by Formula (2):

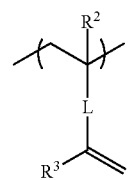

wherein in Formula (2), $R^2$ and $R^3$ each independently represents a hydrogen atom or an alkyl group and L represents any one of the following groups from (L-1) to (L-6):

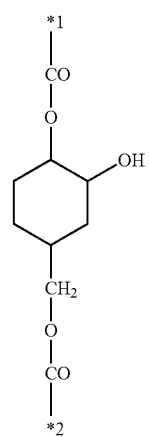

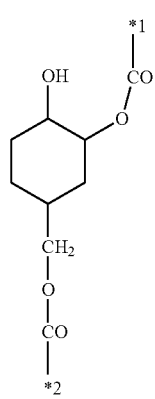

(L-4)

(L-5)

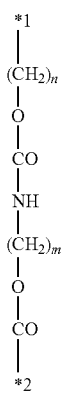

(L-6)

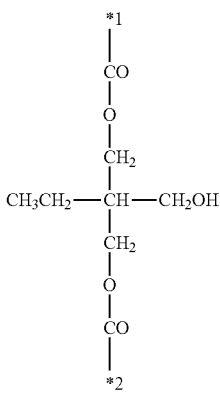

wherein *1 represents a bonding site with a carbon atom included in a main chain in Formula (2), *2 represents a bonding site with a carbon atom forming a double bond in Formula (2), and in (L-5), n and m each independently represents an integer of 1 to 6.

24. The photosensitive composition according to claim 1, wherein the functional group selected from a primary hydroxyl group and an amino group is represented by Formula (3):

(3)

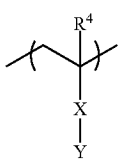

wherein $R^4$ represents a hydrogen atom or an alkyl group, Y represents a primary hydroxyl group or an amino group, and X is a divalent linking group represented by Formula (X-1):

(X-1)

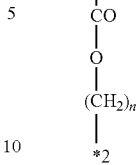

wherein *1 represents a bonding site with a carbon atom included in a main chain in Formula (3), *2 represents a bonding site with Y in Formula (3), and n represents an integer of 1 to 12.

25. The photosensitive composition according to claim 1, wherein the amount of the structural unit including at least one kind of functional group selected from the group consisting of a primary hydroxyl group and an amino group is 5 mol% or more with respect to the total amount of all of the structural units included in the polymer (P).

26. The photosensitive composition according to claim 23, wherein L represents any one of the following groups (L-1), (L-2), and (L-3):

(L-1)

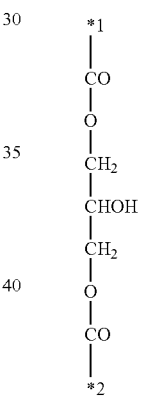

(L-2)

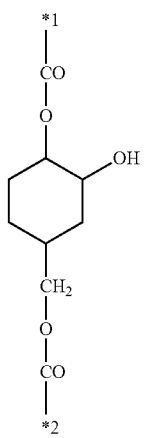

-continued
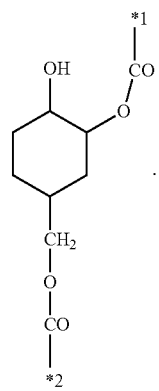
(L-3)